(12) United States Patent
Kim et al.

(10) Patent No.: US 12,178,112 B2
(45) Date of Patent: Dec. 24, 2024

(54) MASK ASSEMBLY AND APPARATUS FOR MANUFACTURING DISPLAY DEVICE

(71) Applicant: Samsung Display Co., Ltd., Yongin-si (KR)

(72) Inventors: Sanghoon Kim, Yongin-si (KR); Jongsung Park, Yongin-si (KR); Hongkyun Ahn, Yongin-si (KR); Sangshin Lee, Yongin-si (KR); Minji Jang, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 278 days.

(21) Appl. No.: 17/702,280

(22) Filed: Mar. 23, 2022

(65) Prior Publication Data

US 2022/0367841 A1   Nov. 17, 2022

(30) Foreign Application Priority Data

May 11, 2021   (KR) .......................... 10-2021-0060743

(51) Int. Cl.
  *C23C 14/04*   (2006.01)
  *C23C 16/04*   (2006.01)
  *H10K 71/00*   (2023.01)
  *H10K 71/16*   (2023.01)
  *H10K 59/124*   (2023.01)

(52) U.S. Cl.
  CPC ........... *H10K 71/00* (2023.02); *C23C 14/042* (2013.01); *C23C 16/042* (2013.01); *H10K 59/124* (2023.02)

(58) Field of Classification Search
  CPC .... H10K 71/166; H10K 71/00; H10K 59/124; H10K 59/03; C30B 25/04; C23C 8/04; C23C 10/04; C23C 14/04; C23C 14/042; C23C 14/044; C23C 16/04; C23C 16/042; C23C 18/06; C23C 14/32; C23C 14/34; C23C 14/56; C23C 16/54
  See application file for complete search history.

(56) References Cited

U.S. PATENT DOCUMENTS

| | | | | |
|---|---|---|---|---|
| 2014/0150721 | A1* | 6/2014 | Oh | C23C 14/042 118/504 |
| 2015/0376765 | A1* | 12/2015 | Xiong | C23C 14/042 118/721 |
| 2018/0163290 | A1* | 6/2018 | Xu | H10K 71/00 |
| 2020/0381495 | A1 | 12/2020 | Jeon et al. | |
| 2021/0141304 | A1 | 5/2021 | Liu et al. | |

(Continued)

FOREIGN PATENT DOCUMENTS

| CN | 110760790 A | * | 2/2020 |
|---|---|---|---|
| CN | 110764362 | | 2/2020 |
| KR | 10-2020-0136549 | | 12/2020 |

*Primary Examiner* — Aiden Lee
(74) *Attorney, Agent, or Firm* — KILE PARK REED & HOUTTEMAN PLLC

(57) ABSTRACT

A mask assembly includes a first mask area including first opening areas, and a second mask area including second opening areas having centers located at vertices of virtual squares in a row direction and a column direction, half-etching areas having centers located at centers of the virtual squares, and a non-etching area surrounding the second opening areas and the half-etching areas. Each of the second opening areas includes a base portion and at least one protrusion portion protruding from the base portion.

20 Claims, 11 Drawing Sheets

(56) References Cited

U.S. PATENT DOCUMENTS

2021/0241671 A1 8/2021 Lee et al.
2021/0305542 A1* 9/2021 Kim .................. H10K 59/1201
2021/0313515 A1* 10/2021 Jung .................... C23C 14/042

* cited by examiner

MASK ASSEMBLY AND APPARATUS FOR MANUFACTURING DISPLAY DEVICE

CROSS-REFERENCE TO RELATED APPLICATION(S)

This application is based on and claims priority to and benefits of Korean Patent Application No. 10-2021-0060743 under 35 U.S.C. § 119, filed on May 11, 2021 in the Korean Intellectual Property Office, the disclosure of which is incorporated by reference herein in its entirety.

BACKGROUND

1. Technical Field

The disclosure relates to a mask assembly and an apparatus for manufacturing a display device, and more particularly, to a mask assembly and an apparatus for manufacturing a display device capable of preventing a defect that may occur in a mask process.

2. Description of the Related Art

Display devices have been used for various purposes and their popularity has grown in various fields. Also, there has been a trend and a demand of thinner and lighter display devices.

As a display area increases in a display device, various functions are combined or associated with a display device. For adding various functions and increasing the display area thereof, techniques for a display device having various functions and displaying images inside of the display area have been of interest for many years.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments herein are directed to prevent a defect caused by a repulsive force generated between a mask assembly and a process target in a mask process of a mask assembly and an apparatus for manufacturing a display device to provide a mask assembly capable of preventing a defect that may occur in a mask process and an apparatus for manufacturing a display device. However, these problems are merely examples, and the scope of the disclosure is not limited thereto.

Additional aspects will be set forth in part in the description which follows and, in part, will be apparent from the description, or may be learned by practice of the presented embodiments.

According to one or more embodiments, a mask assembly may include a first mask area including first opening areas, and a second mask area including second opening areas, half-etching areas, and a non-etching area. Centers of the second opening areas may be located at vertexes of virtual squares in a row direction and a column direction. Centers of the half-etching areas may be located at centers of the virtual squares. The non-etching area may surround the second opening areas and the half-etching areas. Each of the second opening areas may include a base portion and at least one protrusion portion protruding from the base portion.

According to the embodiments, the at least one protrusion portion may include an upper protrusion portion protruding from an upper side of the base portion and a lower protrusion portion protruding from a lower side of the base portion.

According to the embodiments, each of the virtual squares may have a side in the row direction and a side in the column direction, and a length of the side in the row direction may be less than a length of the side in the column direction.

According to the embodiments, the at least one protrusion portion may include a left protrusion portion protruding from a left side of the base portion, and a right protrusion portion protruding from a right side of the base portion.

According to the embodiments, each of the virtual squares may have a side in the row direction and a side in the column direction, and a length of the side in the row direction may be greater than a length of the side in the column direction.

According to the embodiments, the at least one protrusion portion may include an upper protrusion portion protruding from an upper side of the base portion, a lower protrusion portion protruding from a lower side of the base portion, a left protrusion portion protruding from a left side of the base portion, and a right protrusion portion protruding from a right side of the base portion.

According to the embodiments, each of the virtual squares may have a side in the row direction, and a side in the column direction, and a length of the side in the row direction may be equal to a length of the side in the column direction.

According to the embodiments, an effective thickness of the second mask area may be greater than an effective thickness of the first mask area.

According to the embodiments, a difference between the effective thickness of the first mask area and the effective thickness of the second mask area may be about 3 µm or less.

According to the embodiments, an interval between adjacent ones of the second opening areas may be greater than an interval between adjacent ones of the first opening areas.

According to the embodiments, a diameter of each of the second opening areas may be greater than a diameter of each of the first opening areas.

According to one or more embodiments, an apparatus for manufacturing a display device including a first display area in which first subpixels are disposed and a second display area in which second subpixels are disposed, may include a chamber in which a substrate is arranged, and a mask assembly that forms an emission layer over the substrate. The mask assembly may include a first mask area including first opening areas, and a second mask area including second opening areas having centers located at vertices of virtual squares in a row direction and a column direction, half-etching areas having centers located at centers of the virtual squares, and a non-etching area surrounding the second opening areas and the half-etching areas. Each of the second opening areas may include a base portion and at least one protrusion portion protruding from the base portion. The emission layer of each of the first subpixels may have a shape corresponding to a shape of the first opening areas, and the emission layer of each of the second subpixels may have a shape corresponding to a shape of the second opening areas.

According to the embodiments, the at least one protrusion portion may include an upper protrusion portion protruding from an upper side of the base portion, and a lower protrusion portion protruding from a lower side of the base portion.

According to the embodiments, an upper side and a lower side of the emission layer of each of the second subpixels may protrude in a plan view.

According to the embodiments, the at least one protrusion portion may include a left protrusion portion protruding from a left side of the base portion, and a right protrusion portion protruding from a right side of the base portion.

According to the embodiments, a left side and a right side of the emission layer of each of the second subpixels may protrude in a plan view.

According to the embodiments, the at least one protrusion portion may include an upper protrusion portion protruding from an upper side of the base portion, a lower protrusion portion protruding from a lower side of the base portion, a left protrusion portion protruding from a left side of the base portion, and a right protrusion portion protruding from a right side of the base portion.

According to the embodiments, an upper side, a lower side, a left side, and a right side of the emission layer of each of the second subpixels may protrude in a plan view.

According to the embodiments, an effective thickness of the second mask area may be greater than an effective thickness of the first mask area, and a difference between the effective thickness of the first mask area and the effective thickness of the second mask area may be about 3 μm or less.

According to the embodiments, an interval between adjacent ones of the second opening areas may be greater than an interval between adjacent ones of the first opening areas, a diameter of each of the second opening areas may be greater than a diameter of each of the first opening areas, an interval between emission layers of adjacent ones of the second subpixels may be smaller than an interval between emission layers of adjacent ones of the first subpixels, and a diameter of the emission layer of each of the second subpixels may be greater than a diameter of the emission layer of each of the first subpixels.

Other aspects, features, and advantages other than those described above will become apparent from the following detailed description, the appended claims, and the accompanying drawings.

BRIEF DESCRIPTION OF THE DRAWINGS

The above and other aspects, features, and advantages of certain embodiments will be more apparent from the following description taken in conjunction with the accompanying drawings, in which.

DETAILED DESCRIPTION OF THE EMBODIMENTS

Figure 1:
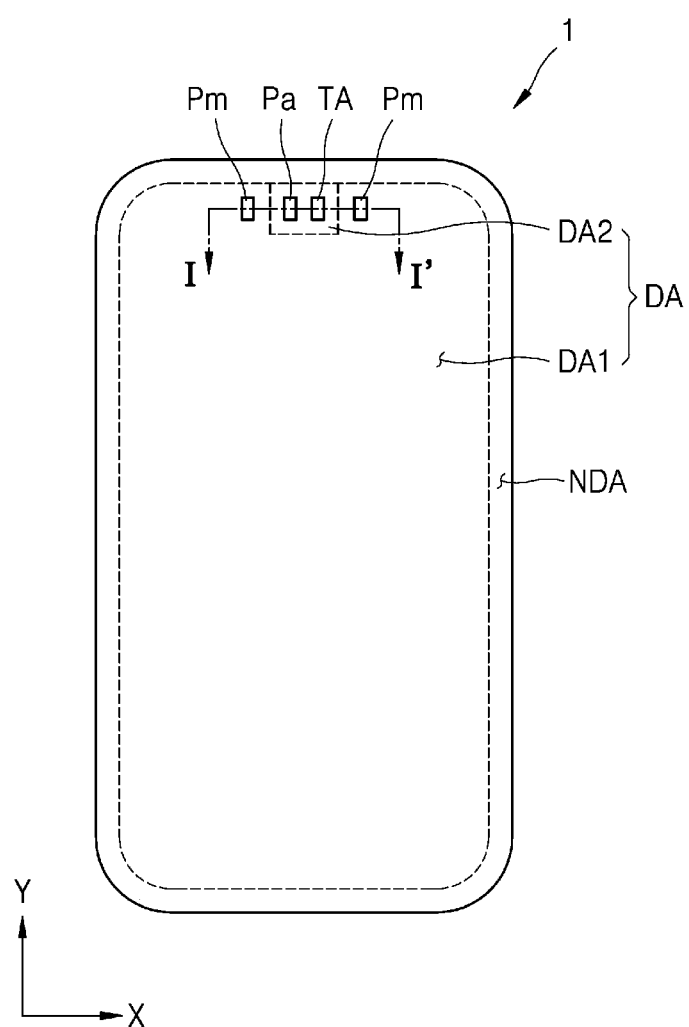
FIG. 1 is a plan view schematically illustrating a portion of a display device according to an embodiment.

Embodiments are described below with reference to the accompanying drawings. Although the embodiments may be modified in various manners and have additional embodiments, the embodiments are illustrated in the accompanying drawings and will be mainly described in the specification. However, the scope of the invention is not limited to the embodiments in the accompanying drawings and the specification and should be construed as including all the changes, equivalents and substitutions included in the spirit and scope of the invention.

The drawings and description are to be regarded as only illustrative in nature, and thus are not limiting of the embodiments described and claimed herein. Some of the parts which are not associated with the description may not be provided in order to describe the embodiments and like reference numerals refer to like elements throughout the specification. Throughout the disclosure, the expression of "at least one of a, b and c" may indicate or include only a, only b, only c, both a and b, both a and c, both b and c, all of a, b, and c, or variations thereof.

In the drawings, sizes and thicknesses of elements may be enlarged for clarity and ease of description thereof or exaggerated for convenience of description. In other words, because the sizes and thicknesses of elements in the drawings are arbitrarily illustrated for convenience of description, the disclosure is not limited thereto. In the drawings, the thickness of layers, films, panels, regions, and other elements may be exaggerated for clarity. In the drawings, for better understanding and ease of description, the thicknesses of some layers and areas may be exaggerated.

Further, in the specification, the phrase "in a plan view" means when an object portion is viewed from above, and the phrase "in a cross-sectional view" means when a cross-section taken by vertically cutting an object portion is viewed from the side.

When a layer, film, region, substrate, or area, is referred to as being "on" another layer, film, region, substrate, or area, it may be directly on the other film, region, substrate, or area, or intervening films, regions, substrates, or areas, may be present therebetween. Conversely, when a layer, film, region, substrate, or area, is referred to as being "directly on" another layer, film, region, substrate, or area, intervening layers, films, regions, substrates, or areas, may be absent therebetween. Further when a layer, film, region, substrate, or area, is referred to as being "below" another layer, film, region, substrate, or area, it may be directly below the other layer, film, region, substrate, or area, or intervening layers, films, regions, substrates, or areas, may be present therebetween. Conversely, when a layer, film, region, substrate, or area, is referred to as being "directly below" another layer, film, region, substrate, or area, intervening layers, films, regions, substrates, or areas, may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Throughout the specification, when an element is referred to as being "connected" to another element, the element may be "directly connected" to another element, or "electrically connected" to another element with one or more intervening elements interposed therebetween. It will be further understood that when the terms "comprises," "comprising," "includes" and/or "including" are used in this specification, they or it may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein. For example, a first color filter may be any one of a red, green, or blue color filter. A second color filter may be any one of a red, green, or blue color filter. A third color filter may be any one of a red, green, or blue color filter. First and second with respect to the light blocking members may be used interchangeably in the specification.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 80%, 5% of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

When a certain embodiment may be implemented differently, a particular process order may be performed differently from the described order. For example, two consecutively described processes may be performed substantially at the same time or may be performed in an order opposite to the described order.

The x axis, the y axis, and the z axis are not limited to three axes of the rectangular coordinate system and may be interpreted in a broader sense. For example, the x axis, the y axis, and the z axis may be perpendicular to one another or may represent different directions that are not perpendicular to one another.

FIG. 1 is a plan view schematically illustrating a portion of a display device according to an embodiment.

Referring to FIG. 1, a display device 1 according to an embodiment may include a display area DA and a non-display area NDA.

The display area DA may include a first display area DA1 in which first subpixels Pm are arranged and a second display area DA2 in which second subpixels Pa are arranged. Also, the second display area DA2 may include transmission areas TA in which the second subpixels Pa are not disposed. The first display area DA1 may surround at least a portion of the second display area DA2. In an embodiment, the first display area DA1 may entirely surround the second display area DA2. The first display area DA1 and the second display area DA2 may independently display images or display one image together.

Display elements are not disposed in the non-display area NDA, and an image is not displayed in the non-display area NDA. The non-display area NDA may surround at least a portion of the display area DA. In an embodiment, the non-display area NDA may entirely surround the display area DA.

The display device 1 includes the first display area DA1, the second display area DA2, and the non-display area NDA. Also, it may be understood that a substrate 100 (refer to FIG. 2) of the display device 1 includes the first display area DA1, the second display area DA2, and the non-display area NDA.

Although the display device 1 including one second display area DA2 having a square shape, which is disposed at an upper (+y direction) center of the first display area DA1 in a plan view, is illustrated in FIG. 1, the disclosure is not limited thereto. For example, the second display area DA2 may be disposed in the first display area DA1, and the second display area DA2 may be entirely surrounded by the first display area DA1. The second display area DA2 may be disposed at an upper right side or an upper left side in the first display area DA1. The second display area DA2 may be disposed at one side of the display device 1 in various shapes such as a bar type, a notch type, and other suitable types. Also, the display device 1 may include second display areas DA2. The shapes and sizes of the second display areas DA2 may be different from each other. For example, in the plan view, the second display area DA2 may have various shapes such as circular shapes, elliptical shapes, polygonal shapes such as tetragonal shapes, star shapes, diamond shapes, and other suitable shapes.

The display device 1 may include first subpixels Pm arranged in the first display area DA1 and second subpixels Pa arranged in the second display area DA2. The first subpixels Pm and the second subpixels Pa may emit light to provide an image. In an embodiment, an image displayed in the second display area DA2 may have a lower resolution than an image displayed in the first display area DA1. The second display area DA2 may include transmission areas TA through which light and/or sound may be transmitted. Subpixels may not be disposed in the transmission areas TA. Accordingly, the number of the second subpixels Pa arranged in the second display area DA2 per unit area may be smaller than the number of the first subpixels Pm disposed in the first display area DA1 per unit area.

Hereinafter, an organic light emitting display device will be described as an example of the display device 1. However, it should be noted that the display device of the disclosure is not limited thereto. For example, the display device 1 of the disclosure may be other display devices such as an inorganic light emitting display device, a quantum dot light emitting display device, and other suitable display devices. For example, an emission layer of a display element of the display device 1 may include an organic material or an inorganic material. Also, the display device 1 may include quantum dots only, a mixture of organic materials and quantum dots, a mixture of inorganic materials and quantum dots, and other suitable elements.

Figure 2:
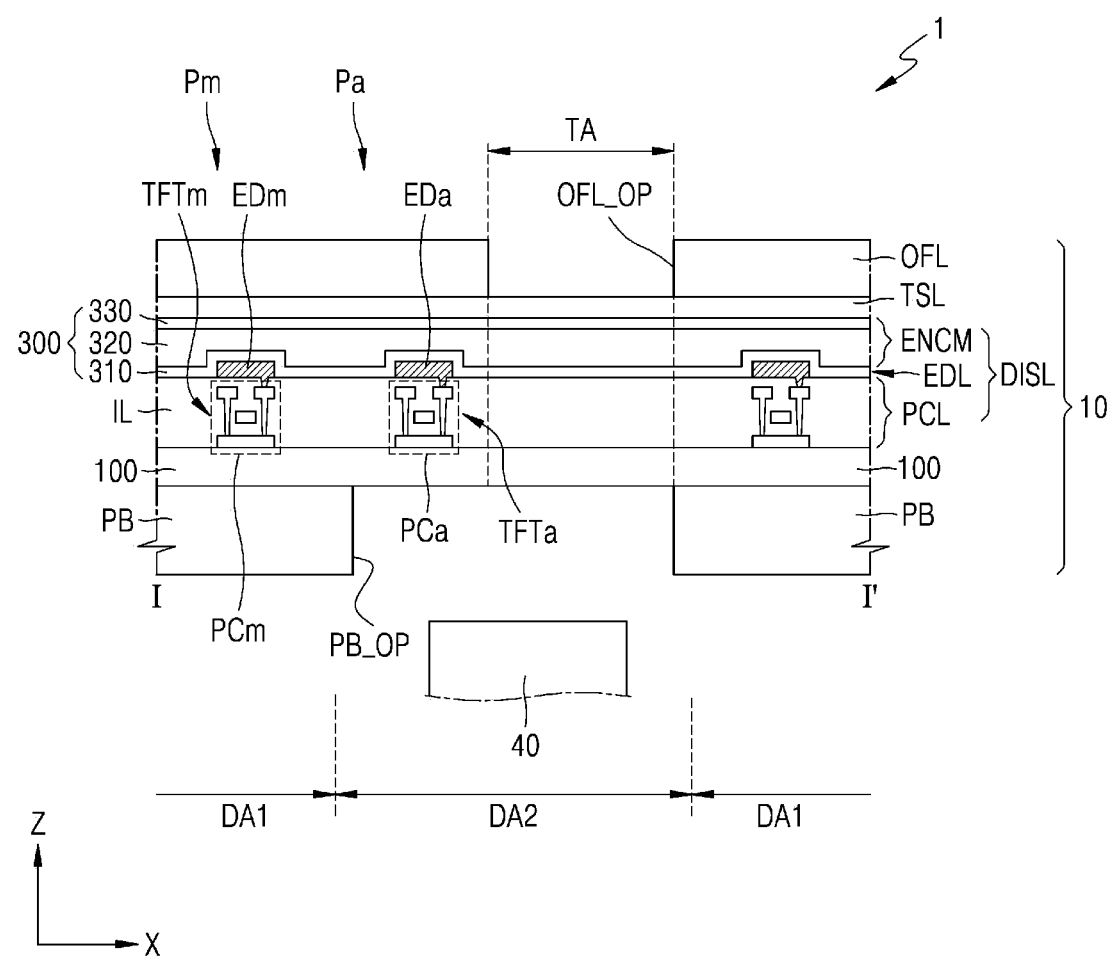
FIG. 2 is a cross-sectional view schematically illustrating a portion of a display device according to an embodiment, taken along line I-I' of FIG. 1.

FIG. 2 is a cross-sectional view schematically illustrating a portion of a display device according to an embodiment, taken along line I-I' of FIG. 1.

Referring to FIG. 2, the display device 1 may include a display panel 10 and a component 40. The component 40 is disposed under the display panel 10 and overlaps the display panel 10. Also, the display device 1 may further include a cover window (not illustrated) disposed on the display panel 10 to protect the display panel 10.

The component 40 may be an electronic device disposed under the display panel 10 in the second display area DA2. In an embodiment, the component 40 may be an electronic device using light and/or sound. For example, the component 40 may be a sensor for measuring a distance, such as a proximity sensor, or a sensor for recognizing a portion of a user's body, such as a fingerprint, an iris, a face, and other suitable biometric methods. Also, the component 40 may be a small lamp emitting light or an image sensor capturing an image, such as a camera.

When the component 40 includes an electronic device using light, the component 40 may use light of various wavelength bands such as visible light, infrared light, and ultraviolet light. The component 40 may also include an electronic device using ultrasonic sound or sound of other frequency bands. In an embodiment, the component 40 may include subcomponents such as a light emitter and a light receiver. The light emitter and the light receiver may be integrally formed. The light emitter and the light receiver may also be physically separable, and a pair of the light emitter and the light receiver may form one component 40. The second display area DA2 may include the transmission areas TA through which the light and/or the sound transmits. For example, the light and/or the sound may output from the component 40 or be incident into the component 40 through the transmission areas TA. Thus, it should be noted that the function of the component 40 is not limited by the above-explained.

The display panel 10 may include a second display area DA2 overlapping the component 40 and a first display area DA1 surrounding at least a portion of the second display area DA2. The display panel 10 may include a substrate 100, a display layer DISL disposed on the substrate 100, a functional layer disposed on the display layer DISL, and a panel protection member PB disposed under the substrate 100. In FIG. 2, a touch screen layer TSL and an optical functional layer OFL are illustrated as examples of the functional layer. However, it should be noted that the disclosure is not limited thereto and the display panel 10 may include various functional layers according to a design of the display panel 10. Also, the functional layer may be omitted.

The display layer DISL may include a circuit layer PCL, a display element layer EDL, and an encapsulation member ENCM. The circuit layer PCL may include thin film transistors. For example, the circuit layer PCL may include at least one first thin film transistor TFTm disposed in the first display area DA1 and at least one second thin film transistor TFTa disposed in the second display area DA2. The display element layer EDL may include a light emitting element that is a display element. For example, the display element layer EDL may include at least one first light emitting element EDm disposed in the first display area DA1 and at least one second light emitting element EDa disposed in the second display area DA2. The encapsulation member ENCM may include an encapsulation layer 300 and/or an encapsulation substrate (not illustrated). An insulating layer IL may be disposed inside the display layer DISL or the like.

The substrate 100 may include an insulating material such as glass, quartz, polymer resin, and other suitable materials. The substrate 100 may include a rigid substrate. In an embodiment, the substrate 100 may include a flexible substrate capable of bending, folding, rolling, or the like.

A first subpixel Pm may be disposed on the substrate 100 in the first display area DA1. A first light emitting element EDm included in the first subpixel Pm and a first pixel circuit PCm electrically connected thereto may be disposed on the substrate 100 in the first display area DA1. The first pixel circuit PCm may include at least one first thin film transistor TFTm and may control the operation of the first light emitting element EDm.

A second subpixel Pa may be disposed on the substrate 100 in the second display area DA2. A second light emitting element EDa included in the second subpixel Pa and a second pixel circuit PCa electrically connected thereto may be arranged over the substrate 100 in the second display area DA2. The second pixel circuit PCa may include at least one second thin film transistor TFTa and may control the operation of the second light emitting element EDa.

A portion of the second display area DA2 without the second light emitting element EDa may be defined as the transmission area TA.

The transmission area TA may transmit the light and/or the signal output from the component 40 or the light and/or the signal incident into the component 40 disposed in the second display area DA2 under the display panel 10. One second pixel circuit PCa, one second light emitting element EDa, and one transmission area TA arranged in the second display area DA2 are illustrated in FIG. 2. However, it should be noted that the number of the second pixel circuit PCa, the second light emitting element Eda, and the transmission area TA is not limited thereto. Second pixel circuits PCa, second light emitting elements EDa, and transmission areas TA may be arranged in the second display area DA2. In an embodiment, the second light emitting elements EDa and the transmission areas TA may be alternately arranged in the second display area DA2. For example, each of the second light emitting elements EDa may be disposed between adjacent ones of the transmission areas TA in the second display area DA2.

The encapsulation layer 300 that is the encapsulation member ENCM may be disposed on the display element layer EDL. In an embodiment, the encapsulation layer 300 may include at least one inorganic encapsulation layer and at least one organic encapsulation layer, both of which cover the display element layer EDL. For example, as illustrated in FIG. 2, the encapsulation layer 300 may include a first inorganic encapsulation layer 310, a second inorganic encapsulation layer 330, and an organic encapsulation layer 320 disposed therebetween.

The first inorganic encapsulation layer 310 and the second inorganic encapsulation layer 330 may include one or more inorganic insulating materials such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), zinc oxide ($ZnO_2$), and other suitable inorganic materials. The first inorganic encapsulation layer 310 and the second inorganic encapsulation layer 330 may be formed by chemical vapor deposition (CVD) or the like. The organic encapsulation layer 320 may include a polymer-based material. The polymer-based material may include silicon-based resin, acryl-based resin (e.g., polymethylmethacrylate, polyacrylic acid, or the like), epoxy-based resin, polyimide, polyethylene, and other suitable polymer-based materials. The first inorganic encapsulation layer 310, the organic encapsulation layer 320, and the second inorganic encapsulation layer 330 may be integrally formed to cover the first display area DA1 and the second display area DA2.

The touch screen layer TSL may be configured to obtain coordinate information according to an external input, for example, a touch event. The touch screen layer TSL may include a touch electrode and touch lines connected to the touch electrode. The touch screen layer TSL may sense the external input by using a self-capacitance method, a mutual capacitance method, and other suitable methods.

The optical functional layer OFL may include an anti-reflection layer. The anti-reflection layer may be configured to reduce the reflectance of light incident into the display device 1 from the outside. For example, the optical functional layer OFL may include a polarization film. In an embodiment, the optical functional layer OFL may include an opening OFL_OP in the transmission area TA. The opening OFL_OP of the optical functional layer OFL may have the same shape and size as the transmission area TA. Accordingly, the light transmittance in the transmission area TA may be significantly reduced by the opening OFL_OP formed through the optical functional layer OFL. The opening OFL_OP may be filled with a transparent material such as optically clear resin (OCR). In other embodiments, the optical functional layer OFL may be implemented with, for example, a filter plate including a black matrix and color filters.

The panel protection member PB may be attached under the substrate 100 to support and protect the substrate 100. The panel protection member PB may include an opening PB_OP in the second display area DA2. The opening PB_OP of the panel protection member PB may have the same shape and size as the second display area DA2. The opening PB_OP of the panel protection member PB may transmit light in the second display area DA2, and thus the light transmittance in the second display area DA2 may be improved. The panel protection member PB may include polyethylene terephthalate, polyimide, and other suitable polymer resins. In other embodiments, the panel protection member PB may not include the opening PB_OP. Also, the panel protection member PB may be omitted.

The second display area DA2 and the component 40 may have various sizes, and it should be noted that the sizes of the second display area DA2 and the component 40 may be changed. For example, the area of the second display area DA2 may be greater or less than the area in which the component 40 is disposed, and the area of the second display area DA2 may be equal to the area in which the component 40 is disposed. The area of the opening PB_OP of the panel protection member PB may be the same size as the second display area DA2. The area of the opening PB_OP of the panel protection member PB may have different size from the second display area DA2. Moreover, although the component 40 illustrated in FIG. 2 is spaced apart from the display panel 10 on one side of the display panel 10, at least a portion of the component 40 may be inserted into the opening PB_OP of the panel protection member PB.

Also, components 40 may be arranged in the second display area DA2. The components 40 disposed in the second display area DA2 may have different functions. For example, the components 40 may include at least two elements of a camera (an imaging device), a solar cell, a flash, a proximity sensor, an illuminance sensor, an iris sensor, and other suitable elements.

The display panel 10 described above may be provided in various electronic devices such as mobile phones, tablet PCs, notebook computers, or smartwatches.

Figure 3:
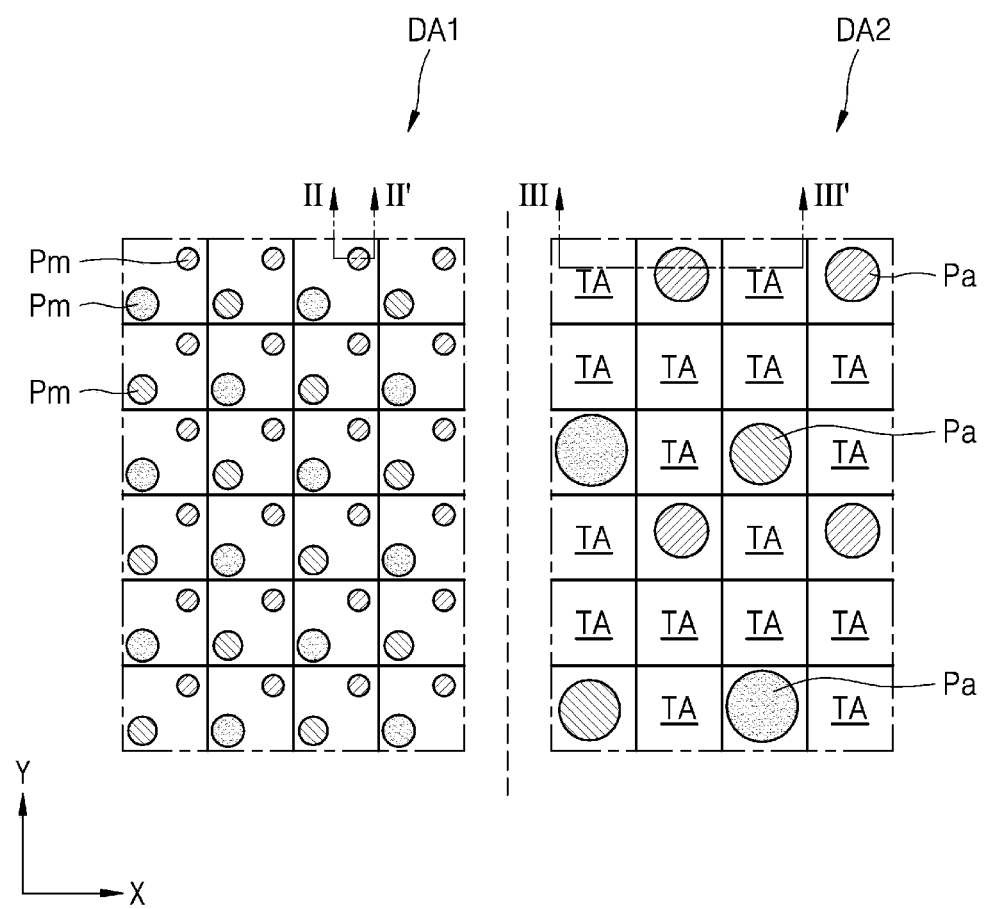
FIG. 3 is a plan view schematically illustrating an arrangement of subpixels and a transmission area included in a display device according to an embodiment.

FIG. 3 is a plan view schematically illustrating the arrangement of subpixels and a transmission area included in a display device according to an embodiment.

Referring to FIG. 3, a display device 1 may include a first display area DA1 and a second display area DA2. First subpixels Pm may be arranged in the first display area DA1, and second subpixels Pa may be arranged in the second display area DA2. Also, the second display area DA2 may include transmission areas TA.

Each of the first subpixels Pm arranged in the first display area DA1 may be implemented with, for example, a display element such as an organic light emitting diode. A first pixel circuit PCm (refer to FIG. 2) for driving the first subpixel Pm may be arranged in the first display area DA1, and the first pixel circuit PCm (refer to FIG. 2) may be disposed to overlap the first subpixel Pm. Each of the first subpixels Pm may emit, for example, red, green, blue, or white light. An encapsulation member ENCM (refer to FIG. 2) may cover the first display area DA1 to protect elements disposed in the first display area DA1 from external air, impurities or moisture.

Each of the second subpixels Pa arranged in the second display area DA2 may be implemented with, for example, a display element such as an organic light emitting diode. A second pixel circuit PCa (see FIG. 2) for driving the second subpixel Pa may be arranged in the second display area DA2, and the second pixel circuit PCa may be disposed to overlap the second subpixel Pa. Each second subpixel Pa may emit, for example, red, green, blue, or white light. The encapsulation member ENCM (refer to FIG. 2) may cover the second display area DA2 together with the first display area DA1 to protect the elements disposed in the first and second display areas DA1 and DA2 from external air, impurities or moisture.

In an embodiment, the first subpixels Pm arranged in the first display area DA1 may have different arrangements from the second subpixels Pa arranged in the second display area DA2. For example, an interval between adjacent ones of the second subpixels Pa arranged in the second display area DA2 may be greater than an interval between adjacent ones of the first subpixels Pm arranged in the first display area DA1. Also, in the plan view, a diameter of each second subpixels Pa (or a diameter of an emission area of the second subpixel Pa) arranged in the second display area DA2 may be greater than a diameter of each first subpixel Pm (or a diameter of an emission area of the first subpixel Pm) arranged in the first display area DA1. For example, the second subpixels Pa arranged in the second display area DA2 may be arranged at a lower density than the first subpixels Pm arranged in the first display area DA1, and a size of the emission area of each second subpixel Pa may be greater than a size of the emission area of each first subpixel Pm.

The second display area DA2 may include transmission areas TA. The transmission areas TA may be defined as an area between the adjacent ones of the second subpixels Pa without any subpixel. As described above, the second subpixels Pa are arranged at a relatively low density in the second display area DA2, and thus, a size of intervening space between the adjacent ones of the second subpixels Pa, for example, the size of each transmission area TA, may be increased. Accordingly, the light transmittance in the second display area DA2 may be improved.

It should be noted that the arrangement of the transmission areas TA is not limited to that illustrated in FIG. 3. For example, the transmission areas TA may be disposed to surround second subpixels Pa. In other embodiments, the transmission areas TA may be alternately arranged to form a grid shape with the second subpixels Pa. Since the second display area DA2 includes the transmission areas TA, the resolution of the second display area DA2 may be smaller than that of the first display area DA1. For example, the resolution of the second display area DA2 may be about ½, ⅜, ⅓, ¼, ⅖, ⅛, ⅑, or 1/16 of the resolution of the first display area DA1.

The first subpixels Pm arranged in the first display area DA1, the second subpixels Pa arranged in the second display area DA2 and the transmission areas TA arranged in the second display area DA2 may be patterned through a mask process. The patterning through the mask process is provided below in detail with reference to FIGS. 5 to 12.

Figure 4:
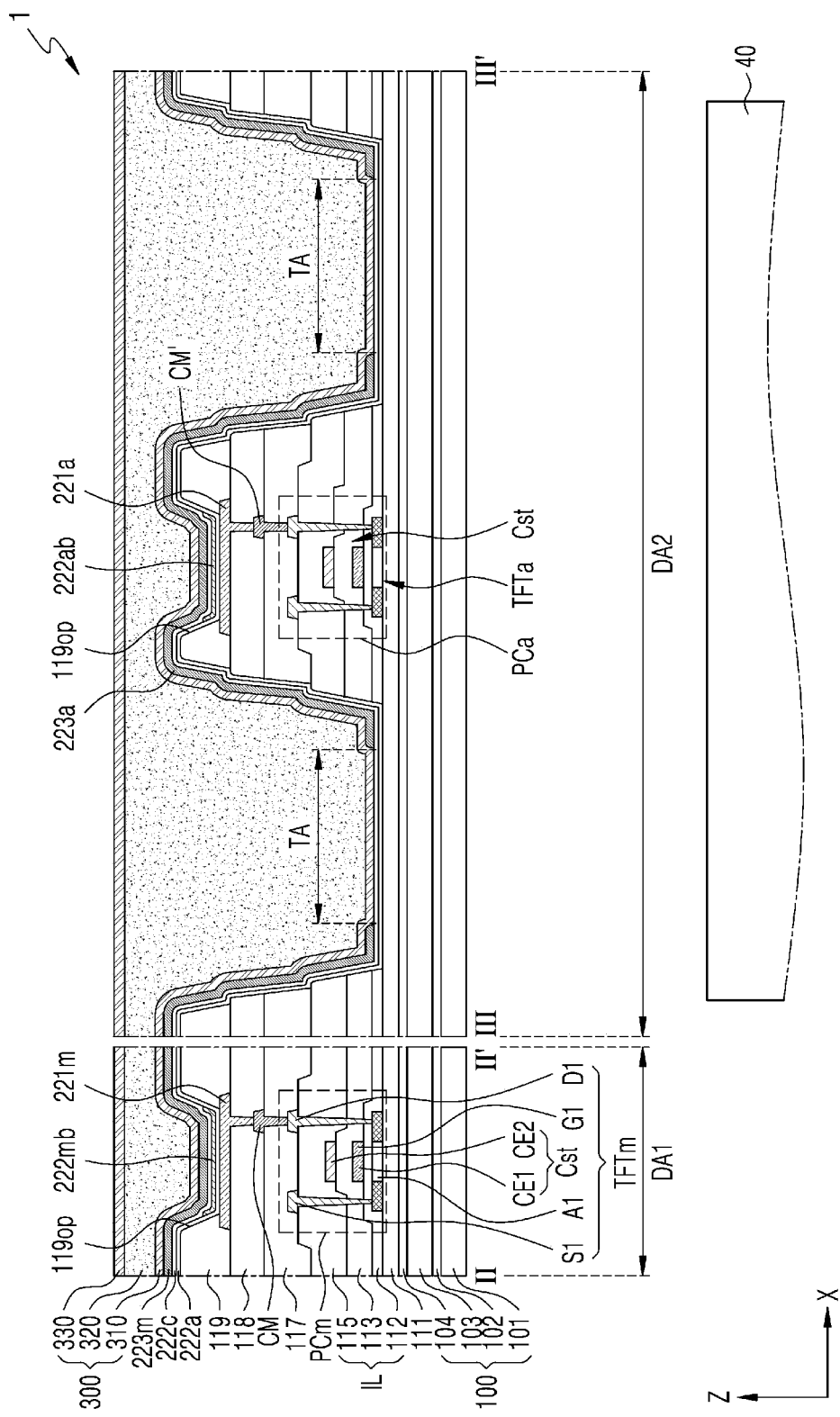
FIG. 4 is a cross-sectional view schematically illustrating a portion of a display device according to an embodiment, taken along lines II-II' and of FIG. 3.

FIG. 4 is a cross-sectional view schematically illustrating a portion of a display device according to an embodiment, taken along lines II-II' and of FIG. 3.

Referring to FIG. 4, a substrate 100 may include above-described various materials, and may have a multi-layer structure. In an embodiment, the substrate 100 may include a first base layer 101, a first barrier layer 102 disposed on the first base layer 101, a second base layer 103 disposed on the first barrier layer 102, and a second barrier layer 104 disposed on the second base layer 103.

The first base layer 101 and the second base layer 103 may include a polymer resin. The polymer resin used for the first base layer 101 and the second base layer 103 may include polyethersulfone, polyarylate, polyacrylate, polyetherimide, polyethylene naphthalate, polyethylene terephthalate, polyphenylene sulfide, polyimide, polycarbonate, cellulose triacetate, cellulose acetate propionate, and other suitable polymer resin. The polymer resin may be transparent.

The first barrier layer 102 and the second barrier layer 104 may be implemented with a barrier layer, which prevents penetration of external materials or impurities. Each of the first barrier layer 102 and the second barrier layer 104 may include a single layer or multiple layers, which includes an inorganic material such as silicon nitride, silicon oxynitride, silicon oxide, and other suitable inorganic materials.

A buffer layer 111 may be disposed on the substrate 100. The buffer layer 111 may reduce or block the penetration of external materials, moisture, impurities or external air from the bottom of the substrate 100. and the buffer layer 111 may also planarize an upper surface of the substrate 100. The buffer layer 111 may include an inorganic insulating material such as silicon oxide, silicon oxynitride, silicon nitride, and other suitable inorganic materials. The buffer layer 111 may have a single-layer or multi-layer structure, which includes the above-mentioned inorganic insulating material. In other embodiments, the buffer layer 111 may be omitted.

Pixel circuits including a thin film transistor (TFT) and a storage capacitor Cst may be disposed on the substrate 100. A first pixel circuit PCm may be disposed on the substrate 100 in a first display area DA1, and a second pixel circuit PCa may be disposed on the substrate 100 in a second display area DA2. The first pixel circuit PCm of the first display area DA1 may have the same structure as the second pixel circuit PCa of the second display area DA2.

A first thin film transistor TFTm of the first pixel circuit PCm disposed in the first display area DA1 may include a first semiconductor layer A1, a first gate electrode G1 overlapping a channel area of the first semiconductor layer A1, a first source electrode S1 connected to a source area of the first semiconductor layer A1, and a first drain electrode D1 connected to a drain area of the first semiconductor layer A1. A gate insulating layer 112 may be disposed between the first semiconductor layer A1 and the first gate electrode G1. A first interlayer insulating layer 113 and a second interlayer insulating layer 115 may be disposed between the first gate electrode G1 and the first source electrode S1 or between the first gate electrode G1 and the first drain electrode D1.

The storage capacitor Cst may be disposed to overlap the first thin film transistor TFTm. The storage capacitor Cst may include a lower electrode CE1 and an upper electrode CE2 overlapping each other. In an embodiment, the first gate electrode G1 of the first thin film transistor TFTm may be integrally formed with the lower electrode CE1 of the storage capacitor Cst. The first interlayer insulating layer 113 may be disposed between the lower electrode CE1 and the upper electrode CE2.

The first semiconductor layer A1 may include polysilicon. In an embodiment, the first semiconductor layer A1 may include amorphous silicon. In an embodiment, the first semiconductor layer A1 may include at least one oxide selected from the group consisting of indium (In), gallium (Ga), tin (Sn), zirconium (Zr), vanadium (V), hafnium (Hf), cadmium (Cd), germanium (Ge), chromium (Cr), titanium (Ti), and zinc (Zn). The first semiconductor layer A1 may include a channel area, a source area, and a drain area, and the source and drain areas may be doped with dopants.

The gate insulating layer 112 may include an inorganic insulating material such as silicon oxide, silicon oxynitride, silicon nitride, and other suitable inorganic insulating materials, and may have a single-layer or multi-layer structure, which includes the above-mentioned material.

The first gate electrode G1 and/or the lower electrode CE1 may include a low-resistance conductive material such as molybdenum (Mo), aluminum (Al), copper (Cu), titanium (Ti), and alloys thereof. The first gate electrode G1 and/or the lower electrode CE1 may have a single-layer or multi-layer structure, which includes the above-mentioned material. For example, the first gate electrode G1 may have a triple-layer structure of molybdenum layer/aluminum layer/molybdenum layer.

The first interlayer insulating layer 113 may include an inorganic insulating material such as silicon oxide, silicon oxynitride, silicon nitride, and other suitable inorganic insulating materials. The first interlayer insulating layer 113 may have a single-layer or multi-layer structure, which includes the above-mentioned material.

The upper electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), copper (Cu), and alloys thereof. and the upper electrode CE2 may have a single-layer or multi-layer structure, which includes the above-mentioned material.

The second interlayer insulating layer 115 may include an inorganic insulating material such as silicon oxide, silicon oxynitride, silicon nitride, and other suitable inorganic insulating materials. The second interlayer insulating layer 115 may have a single-layer or multi-layer structure, which includes the above-mentioned material.

The first source electrode S1 and/or the first drain electrode D1 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), copper (Cu), and alloys thereof. The first source electrode S1 and/or the first drain electrode D1 may have a single-layer or multi-layer structure, which includes the above-mentioned material. For example, the first source electrode S1 and/or the first drain electrode D1 may have a triple-layer structure of titanium layer/aluminum layer/titanium layer.

The first pixel circuit PCm including the first thin film transistor TFTm and the storage capacitor Cst may be electrically connected to a first pixel electrode 221*m* disposed on the substrate 100 in the first display area DA1. For example, as illustrated in FIG. 4, the first pixel circuit PCm may be electrically connected to the first pixel electrode 221*m* by a contact metal CM that is a connection line between the first pixel circuit PCm and the first pixel electrode 221*m*.

The contact metal CM may be disposed on a first planarization layer 117. The contact metal CM may be connected to the first pixel circuit PCm through a contact hole formed through the first planarization layer 117. The contact metal CM may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), copper (Cu), and alloys thereof. The contact metal CM may have a single-layer or multi-layer structure, which includes the above-mentioned material.

The first planarization layer 117 may include an organic insulating material. For example, the first planarization layer 117 may include an organic insulating material such as acryl, benzocyclobutene (BCB), polyimide, hexamethyldisiloxane (HMDSO), and other suitable organic insulating materials. The organic insulating material of the first planarization layer 117 may include a photosensitive organic insulating material.

A second planarization layer 118 may be disposed on the contact metal CM. The second planarization layer 118 may include an organic insulating material. The second planarization layer 118 may include an organic insulating material such as acryl, benzocyclobutene (BCB), polyimide, hexamethyldisiloxane (HMDSO), and other suitable organic insulating material. The organic insulating material of the second planarization layer 118 may include a photosensitive organic insulating material.

The first pixel electrode 221*m* may be disposed on the second planarization layer 118. The first pixel electrode 221*m* may be connected to the contact metal CM through a contact hole formed through the second planarization layer 118.

The first pixel electrode 221*m* may include a reflective layer including silver (Ag), magnesium (Mg), aluminum (Al), platinum (Pt), palladium (Pd), gold (Au), nickel (Ni), neodymium (Nd), iridium (Ir), chromium (Cr), and alloys thereof. The first pixel electrode 221*m* may have a double-layer structure, which includes a reflective layer including the above-mentioned material and a transparent conductive layer disposed on the reflective layer. The first pixel electrode 221 may also have a double-layer structure, which includes a reflective layer and a transparent conductive layer disposed under the reflective layer. The transparent conductive layer of the first pixel electrode 221*m* may include indium tin oxide (ITO), indium zinc oxide (IZO), zinc oxide (ZnO), indium oxide ($In_2O_3$), indium gallium oxide (IGO), aluminum zinc oxide (AZO), and other suitable transparent conductive materials. In an embodiment, the first pixel electrode 221*m* may have a triple-layer structure of ITO layer/Ag layer/ITO layer, which are sequentially stacked.

Although a configuration in which the first pixel circuit PCm and the first pixel electrode 221*m* are disposed in the first display area DA1 have been described above, the second pixel circuit PCa and a second pixel electrode 221*a* disposed in the second display area DA2 may also have the same structure. For example, a second thin film transistor TFTa of the second pixel circuit PCa disposed in the second display area DA2 may have the same/similar structure as the first thin film transistor TFTm of the first pixel circuit PCm, and the second pixel electrode 221*a* disposed in the second display area DA2 may have the same/similar structure as the first pixel electrode 221*m*. In the display device 1 according to the embodiment shown in FIG. 4, the second pixel electrode 221*a* is electrically connected to the second thin film transistor TFTa including a second semiconductor layer and a second gate electrode through a contact metal CM' that is a connection line. The contact metal CM' disposed in the second display area DA2 has the same/similar structure as the contact metal CM disposed in the first display area DA1, and thus, any repetitive explanation for the contact metal CM' disposed on the second display area DA2 will be omitted.

A pixel definition layer 119 may be disposed on the first pixel electrode 221*m* and the second pixel electrode 221*a*. The pixel definition layer 119 may cover an edge of the first pixel electrode 221*m* and an edge of the second pixel electrode 221*a*. The pixel definition layer 119 may include an opening 119*op* overlapping a center portion of each of the first pixel electrode 221*m* and the second pixel electrode 221*a*. The pixel definition layer 119 may include an organic material such as polyimide, polyamide, acrylic resin, benzocyclobutene (BCB), hexamethyldisiloxane (HMDSO), phenolic resin, and other suitable organic materials.

A first functional layer 222*a* and a second functional layer 222*c* may be disposed on the pixel definition layer 119, the first pixel electrode 221*m*, and the second pixel electrode 221*a*. Each of the first functional layer 222*a* and the second functional layer 222*c* may entirely cover the first display area DA1 and the second display area DA2. In other embodiments, the first functional layer 222*a* and the second functional layer 222*c* may have an opening disposed in the transmission areas TA. The opening of the first and second functional layers 222*a* and 222*c* may have the same shape and size as the transmission areas TA.

The first functional layer 222*a* may include a single layer or multiple layers. For example, the first functional layer 222*a* may be implemented with, for example, a hole transport layer (HTL) having a single-layer structure and may include a high-molecular weight material such as poly-(3, 4)-ethylene-dihydroxy thiophene (PEDOT), polyaniline, and other suitable high-molecular weight materials. When the first functional layer 222a may be implemented with, for example a hole injection layer (HIL) and an HTL made of a low-molecular weight material.

The second functional layer 222c may be selectively implemented according to the design of the display device 1. For example, when the first functional layer 222a or the like is formed of the high-molecular weight material, the second functional layer 222c may be disposed on the first functional layer 222a. The second functional layer 222c may include a single layer or multiple layers. The second functional layer 222c may include an electron transport layer (ETL) and/or an electron injection layer (EIL).

A first emission layer 222mb may be disposed on the first functional layer 222a or between the first functional layer 222a and the second functional layer 222c. A second emission layer 222ab may also be disposed on the first functional layer 222a or between the first functional layer 222a and the second functional layer 222c. The first emission layer 222mb may be patterned to have a shape corresponding to a shape of the first pixel electrode 221m, and the second emission layer 222ab may be patterned to have a shape correspond to a shape of the second pixel electrode 221a. The first emission layer 222mb and the second emission layer 222ab may have the same shape and size as the first pixel electrode 221m and the second pixel electrode 221a, respectively. The first emission layer 222mb and the second emission layer 222ab may include an organic material. The first emission layer 222mb and the second emission layer 222ab may include a high-molecular weight organic material or a low-molecular weight organic material that may emit light of a predetermined color.

A second opposite electrode 223a overlapping the second pixel electrode 221a may be disposed on the second emission layer 222ab, and a first opposite electrode 223m overlapping the first pixel electrode 221m may be disposed on the first emission layer 222mb. The second opposite electrode 223a may be integrally formed with the first opposite electrode 223m. The second opposite electrode 223a and the first opposite electrode 223m may include a conductive material having a relatively low work function. For example, the second opposite electrode 223a and the first opposite electrode 223m may include a transparent layer or a semi-transparent layer, which includes silver (Ag), magnesium (Mg), aluminum (Al), nickel (Ni), chromium (Cr), lithium (Li), calcium (Ca), and alloys thereof. In other embodiments, the second opposite electrode 223a and the first opposite electrode 223m may further include another layer including oxides such as ITO, IZO, ZnO, $In_2O_3$, and other suitable oxides, which is disposed on the transparent layer or the semi-transparent layer, which includes the above-mentioned material. In an embodiment, the second opposite electrode 223a and the first opposite electrode 223m may include silver (Ag) and magnesium (Mg). Also, the second opposite electrode 223a and the first opposite electrode 223m may include an alloy of silver (Ag) and magnesium (Mg).

The first pixel electrode 221m, the first emission layer 222mb, and the first opposite electrode 223m may be sequentially stacked to form a stack structure. The stack structure of the first pixel electrode 221m, the first emission layer 222mb, and the first opposite electrode 223m may form a light emitting diode, for example, an organic light emitting diode. The second pixel electrode 221a, the second emission layer 222ab, and the second opposite electrode 223a may also be sequentially stacked to form a stack structure. The stack structure of the second pixel electrode 221a, the second emission layer 222ab, and the second opposite electrode 223a may also form a light emitting diode, for example, an organic light emitting diode. The organic light emitting diode may emit red, green, or blue light, and an emission area of each organic light emitting diode may be implemented with to a pixel. For example, the emission area of the organic light emitting diode disposed in the first display area DA1 may be implemented with the first subpixel Pm (refer to 3), and the emission area of the organic light emitting diode disposed in the second display area DA2 may be implemented with the second subpixel Pa (refer to FIG. 3). Since the opening 119op of the pixel definition layer 119 defines the size and/or width of the emission area, the size and/or width of the first subpixel Pm (refer to FIG. 3) and the second subpixel Pa (refer to FIG. 3) may depend on the opening 119op of the pixel defining layer 119.

As described above, a first inorganic encapsulation layer 310, a second inorganic encapsulation layer 330, and an organic encapsulation layer 320 disposed therebetween may cover the organic light emitting diode.

Openings may be formed through the insulating layers IL disposed on the substrate 100 in the transmission areas TA. For example, the buffer layer 111 may be interposed between the insulating layers IL and the substrate 100. The openings formed through the insulating layers IL may have the same size and/or width as the transmission areas TA. For example, Openings (not illustrated in FIG. 4) may be formed through the gate insulating layer 112, the first interlayer insulating layer 113, the second interlayer insulating layer 115, the first planarization layer 117, the second planarization layer 118, and/or the pixel definition layer 119 in the transmission areas TA, and may overlap each other. The openings (not illustrated in FIG. 4) formed through the gate insulating layer 112, the first interlayer insulating layer 113, the second interlayer insulating layer 115, the first planarization layer 117, the second planarization layer 118, and/or the pixel definition layer 119 may have the same size and/or width as the transmission area TA.

Figure 5:
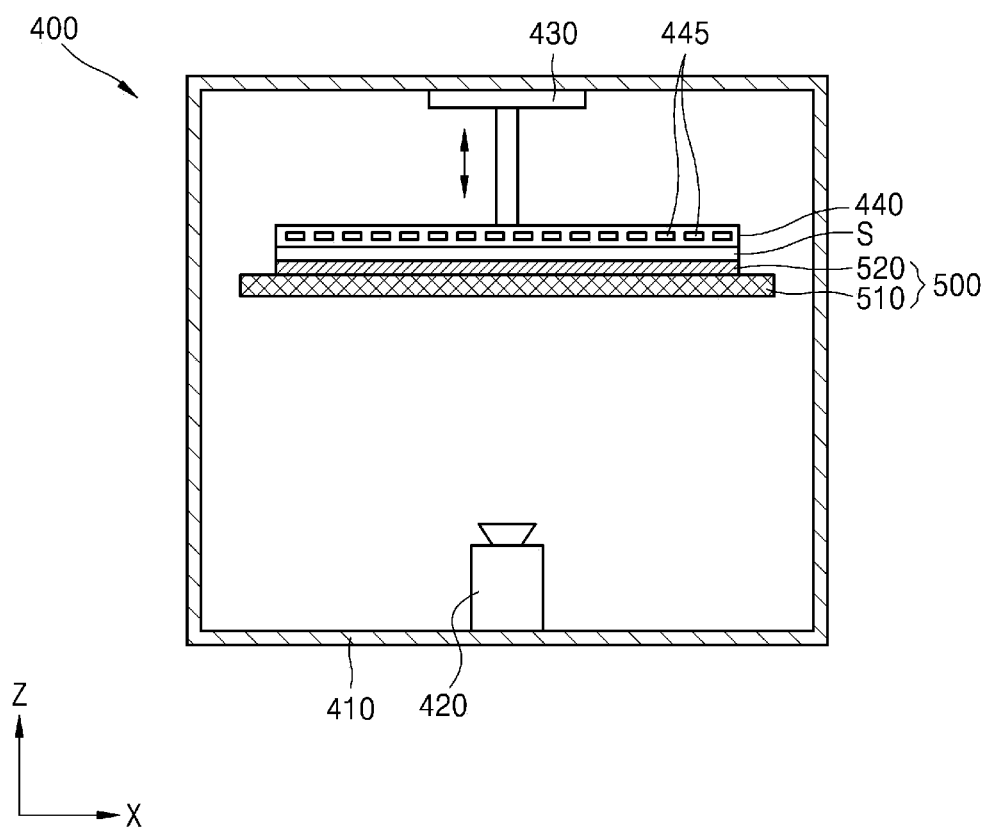
FIG. 5 is a cross-sectional view schematically illustrating an apparatus for manufacturing a display device according to an embodiment.

FIG. 5 is a cross-sectional view schematically illustrating an apparatus for manufacturing a display device according to an embodiment.

Referring to FIG. 5, an apparatus 400 for manufacturing a display device may be used to perform at least a portion of processes for manufacturing a display device. In an embodiment, the apparatus 400 for manufacturing the display device may be an apparatus for depositing an organic material to form an organic layer (e.g., an emission layer) included in a display device. Also, the apparatus 400 for manufacturing the display device may deposit the organic material through a mask process to deposit a patterned layer by using a mask. It should be noted that the type of a deposition process performed by the apparatus 400 for manufacturing the display device is not limited to the mask process. For example, the apparatus 400 for manufacturing the display device may perform physical vapor deposition (PVD) such as vacuum deposition, ion plating, sputtering, chemical vapor deposition (CVD) by gas reaction, and other suitable deposition processes.

Also, a method of manufacturing a display device according to an embodiment may include arranging a mask assembly and a substrate in a chamber, and forming an emission layer over the substrate by using the mask assembly. In this case, in the plan view, the first subpixels Pm (refer to FIG. 3) or the first emission layer 222mb (refer to FIG. 4) of the first subpixels Pm (refer to FIG. 3) may have a shape corresponding to a shape of first opening areas OA1 (refer to FIG. 6), and the second subpixels Pa (refer to FIG. 3) or the second emission layer 222ab (refer to FIG. 4) of the second subpixels Pa (refer to FIG. 3) may have a shape corresponding to a shape of second opening areas OA2 (refer to FIG. 6). The first subpixels Pm (refer to FIG. 3) or the first emission layer 222mb (refer to FIG. 4) of the first subpixels Pm (refer to FIG. 3) may have the same shape as the first opening areas OA1 (refer to FIG. 6), and the second subpixels Pa (refer to FIG. 3) or the second emission layer 222ab (refer to FIG. 4) of the second subpixels Pa (refer to FIG. 3) may have the same shape as the second opening areas OA2 (refer to FIG. 6).

The apparatus 400 for manufacturing the display device according to the embodiment may include a chamber 410, a deposition source 420, a support unit 430, and a magnetic force generator 440. A mask assembly 500 may be disposed in the chamber 410.

The chamber 410 may have a space for performing a deposition process inside thereof. For example, the chamber 410 may be a reaction chamber including a predetermined reaction space therein. In an embodiment, the inside of the chamber 410 may be maintained in a low-vacuum state or a high-vacuum state. A pumping unit (not illustrated) may be disposed at one side of the chamber 410. The pumping unit (not illustrated) may discharge the air from the inside of the chamber 410 toward the outside of the chamber 410 to form or maintain the low-vacuum state or the high-vacuum state in the reaction space of the chamber 410.

The apparatus 400 for manufacturing the display device may further include various elements in the space of the chamber 410 used in the deposition process. For example, a support unit 430 and a deposition source 420 may be disposed in the chamber 410. A process target S may be loaded and supported by the support unit 430. The deposition source 420 is disposed to face the support unit 430 in the chamber 410 to supply a deposition material into the reaction space of the chamber 410.

The process target S may be used to deposit a layer or a patterned layer on the substrate 100 (refer to FIG. 4) without any element or layer thereon or the substrate 100 (refer to FIG. 4) having some elements and/or layers formed thereon.

The deposition source 420 may supply a deposition material into the reaction space of the chamber 410. The deposition source 420 may store and hold the deposition material and may spray the deposition material toward the process target S. In an embodiment, the deposition source 420 may include a nozzle (not illustrated) capable of spraying the deposition material toward the process target S in the reaction space of the reaction chamber 410.

The process target S may be disposed on a surface of the support unit 430, and the support unit 430 may support and fix the process target S. The support unit 430 may hold the process target S. In an embodiment, the support unit 430 may move up and down in the chamber 410. The support unit 430 may move up and down at a loading time, an unloading time, or at a time when a deposition process is performed against the process target S. According to an embodiment, the support unit 430 may include a heating member (not illustrated) to heat and maintain the process target S disposed on the support unit 430 at a predetermined temperature. In other embodiments, the support unit 430 may be connected to a heating member (not illustrated) disposed outside of the support unit 430 to heat and maintain the process target S disposed on the support unit 430 at the predetermined temperature.

The magnetic force generator 440 may be disposed in the chamber 410 to hold the process target S and the mask assembly 500. The process target S may be tightly contacted to the mask assembly 500 by the magnetic force generator 440. For example, the magnetic force generator 440 may apply a predetermined magnetic force to the mask assembly 500 in the deposition process to adhere the mask assembly 500 to the process target S. The magnetic force generator 440 may include a magnet 445 generating the magnetic force. The magnet 445 may be disposed in the magnetic force generator 440. The magnet 445 may be an electromagnet or a permanent magnet, but is not limited thereto and may be substituted by any suitable magnet. Also, the number of the magnets 445 of the magnetic force generator 440 is not limited. For example, the magnetic force generator 440 may include one magnet 445. The magnetic force generator 440 may include two or more magnets 445.

The process target S may be fixed to the support unit 430, and one surface of the process target may face the deposition source 420. The mask assembly 500, which may be used for patterning a deposited layer, may be disposed between the process target S and the deposition source 420. For example, in the deposition process, the mask assembly 500 may be disposed on one surface of the process target S, and the magnetic force generator 440 may be disposed on the other surface of the process target S.

The mask assembly 500 may include a frame 510 and a mask sheet 520. The frame 510 may support the mask sheet 520. The mask sheet 520 may include a pattern including one or more opening areas. In the deposition process, the deposition material sprayed from the deposition source 420 may pass through the opening area of the mask sheet 520, and be deposited on the process target S in the opening area of the mask sheet 520. Accordingly, the deposition material may be deposited on the process target S in a pattern corresponding to a pattern of the mask. The pattern of the deposited deposition material may have the same shape and size as the opening area of the mask sheet 520. The mask process and the structure of the mask assembly 500 is provided below in detail with reference to FIGS. 6 to 12.

Figure 6:
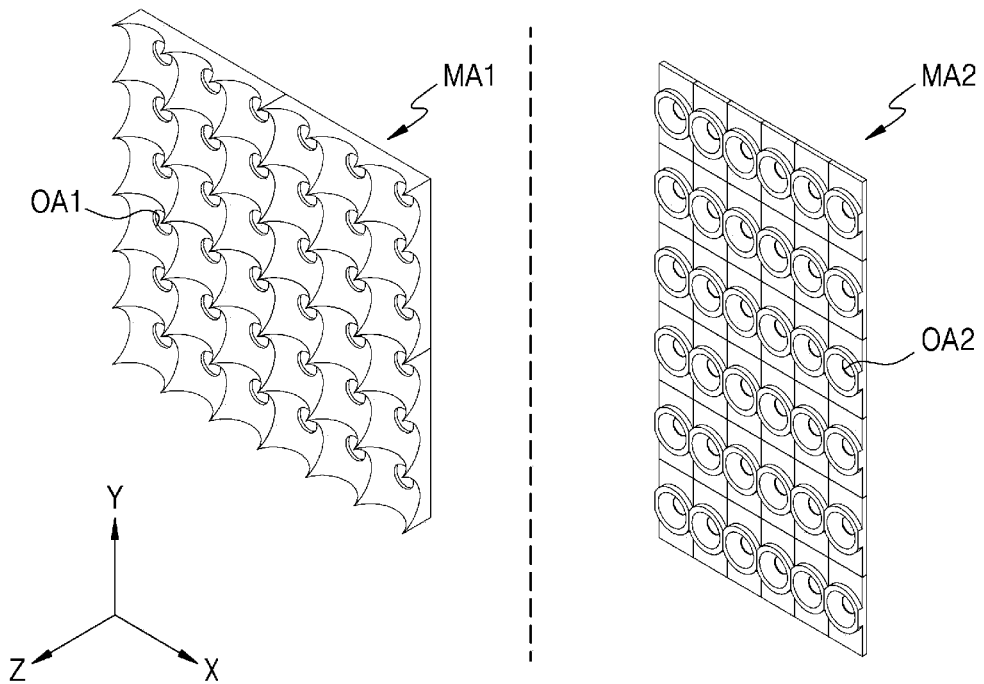
FIG. 6 is a perspective view schematically illustrating a portion of a mask assembly according to an embodiment.
Figure 7:
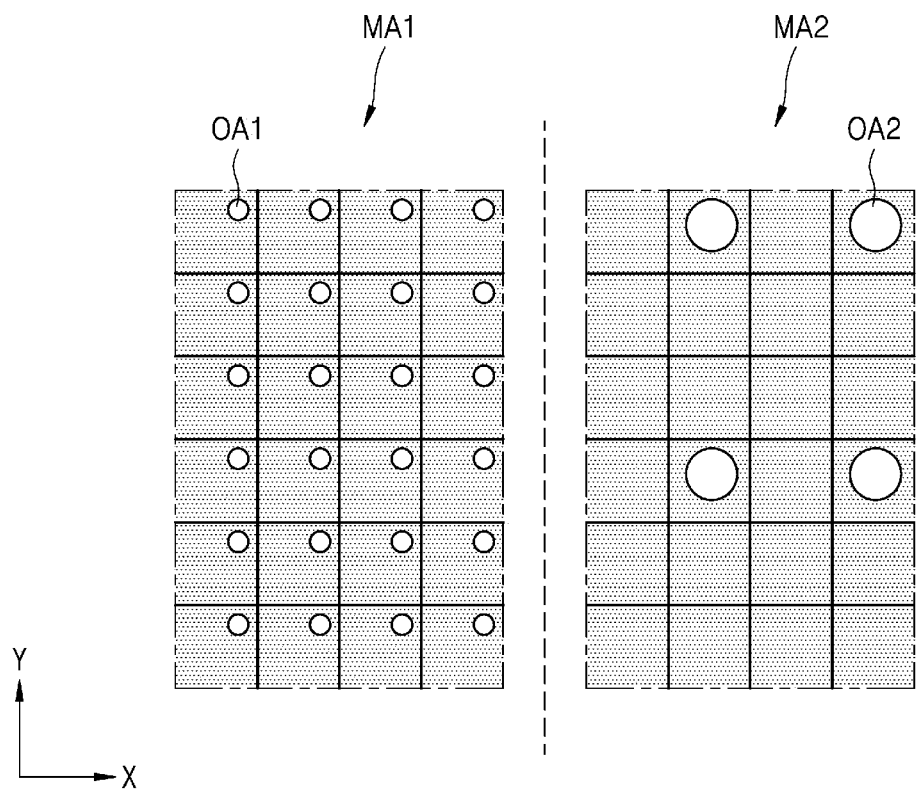
FIG. 7 is a plan view schematically illustrating a portion of a mask assembly according to an embodiment.
Figure 8:
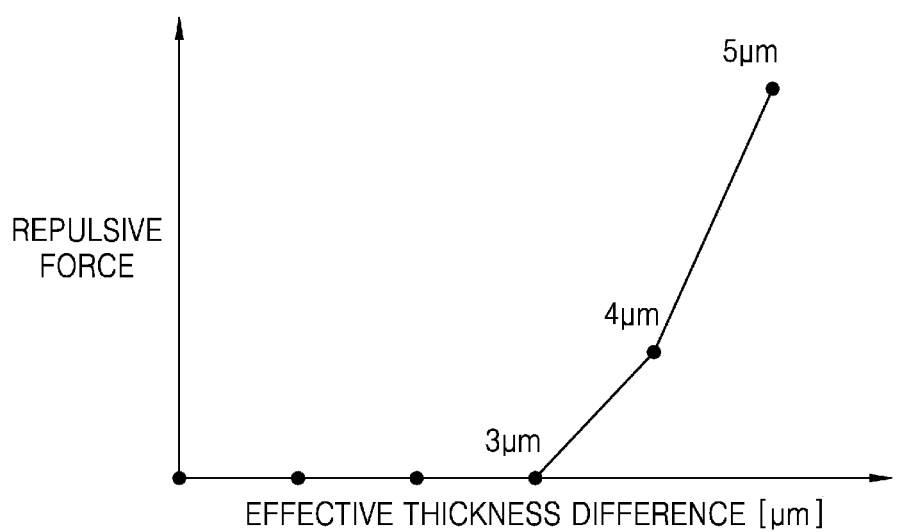
FIG. 8 is a graph schematically illustrating relationship between a repulsive force and an effective thickness difference of a mask assembly according to an embodiment.

FIG. 6 is a perspective view schematically illustrating a portion of a mask assembly according to an embodiment, FIG. 7 is a plan view schematically illustrating a portion of a mask assembly according to an embodiment, and FIG. 8 is a graph schematically illustrating the relationship between a repulsive force and an effective thickness difference of a mask assembly according to an embodiment.

Referring to FIGS. 6 and 7, the mask assembly 500 (refer to FIG. 5) according to an embodiment may include a first mask area MA1 and a second mask area MA2. A mask pattern corresponding to patterns in the first display area DA1 (refer to FIG. 3) is formed in the first mask area MA1. The mask pattern in the first mask area MA1 of the mask assembly 500 (refer to FIG. 5) has the same shape and size as the patterns of a layer deposited in the first display area DA1 (refer to FIG. 3). A mask pattern corresponding to patterns in the second display area DA2 (refer to FIG. 3) is formed in the second mask area MA2. The mask pattern in the second mask area MAs of the mask assembly 500 (refer to FIG. 5) has the same shape and size as the patterns of a layer deposited in the second display area DA2 (refer to FIG. 3). The mask assembly 500 may include heterogeneous patterns. For example, the patterns in the first mask area MA1 of the mask assembly 500 may be different from those in the second mask area MA2.

The first mask area MA1 may include first opening areas OA1. The first opening areas OA1 may be disposed to correspond to the first subpixels Pm (refer to FIG. 3) of the first display area DA1 (refer to FIG. 3). The first opening areas OA1 of the first mask area MA1 may have the same shape and size as the first subpixels Pm (refer to FIG. 3) of the first display area DA1. For example, when the mask assembly 500 (refer to FIG. 5) is disposed on the substrate 100 (refer to FIG. 4) for depositing a layer, the first opening areas OA1 may overlap emission areas of the first subpixels Pm of the first display area DA1 (refer to FIG. 3). For example, the first opening areas OA1 may overlap an area in which the first emission layers 222mb (refer to FIG. 4) of the first subpixels Pm (refer to FIG. 3) in the first display area DA1 (refer to FIG. 3) are to be deposited.

The second mask area MA2 may include second opening areas OA2. The second opening areas OA2 may be disposed to correspond to the second subpixels Pa (refer to FIG. 3) of the second display area DA2 (refer to FIG. 3). The second opening areas OA2 of the second mask area MA2 may have the same shape and size as the second subpixels Pa (refer to FIG. 3) of the second display area DA2. For example, when the mask assembly 500 (refer to FIG. 5) is disposed on the substrate 100 (refer to FIG. 4) for a depositing a layer, the second opening areas OA2 may overlap the emission areas of the second subpixels Pa (refer to FIG. 3) of the second display area DA2 (refer to FIG. 3). For example, the second opening areas OA2 may overlap an area in which the second emission layers 222ab (refer to FIG. 4) of the second subpixels Pa (refer to FIG. 3) of the second display area DA2 (refer to FIG. 3) are to be deposited.

The deposition material may not pass through a portion of the first mask area MA1 in which the first opening areas OA1 are not disposed and a portion of the second mask area MA2 in which the second opening areas OA2 are not disposed. For example, the deposition material may not pass through the remaining portion of the first mask area MA1 without the first opening areas OA1 and the remaining portion of the second mask area MA2 without the second opening areas OA2. When the mask assembly 500 (refer to FIG. 5) is disposed on the substrate 100 (refer to FIG. 4) for depositing a layer, a deposition material may not be deposited in an area of the substrate 100 (refer to FIG. 4) that does not overlap the first opening areas OA1 or the second opening areas OA2. For example, the deposition material may not be deposited on the substrate 100 (refer to FIG. 4) in the remaining portion of the first mask area MA1 without the first opening areas OA1 and the remaining portion of the second mask area MA2 without the second opening areas OA2. In an embodiment, a portion of the substrate 100 (refer to FIG. 4) overlapping the remaining portion of the second mask area MA2 without the second opening areas OA2 may be disposed in the transmission area TA (refer to FIG. 3) described above.

In an embodiment, a diameter of the second opening areas OA2 may be greater than that of the first opening areas OA1 in the plan view. Accordingly, the diameter of the second subpixels Pa (refer to FIG. 3) formed in the second display area DA2 (refer to FIG. 3) or the diameter of the second emission layers 222ab (refer to FIG. 4) may be greater than the diameter of the first subpixels Pm (refer to FIG. 3) formed in the first display area DA1 (refer to FIG. 3) or the diameter of the first emission layers 222mb (refer to FIG. 4).

In an embodiment, the first opening areas OA1 of the first mask area MA1 and the second opening areas OA2 of the second mask area MA2 may be arranged in a grid shape. In this case, an interval between adjacent ones of the second opening areas OA2 may be greater than an interval between adjacent ones of the first opening areas OA1. For example, a density of the second opening areas OA2 may be smaller than that of the first opening areas OA1. Accordingly, an interval between adjacent ones of the second subpixels Pa (refer to FIG. 3) formed in the second display area DA2 (refer to FIG. 3) or an interval between adjacent ones of the second emission layers 222ab (refer to FIG. 4) may be greater than an interval between adjacent ones of the first subpixels Pm formed in the first display area DA1 (refer to FIG. 3) or an interval between adjacent ones of the first emission layers 222mb (refer to FIG. 4).

Accordingly, the transmission areas TA (refer to FIG. 3) formed in the second display area DA2 (refer to FIG. 3) of the substrate 100 (refer to FIG. 4) overlapping the second mask area MA2 may be secured. For example, a size of the transmission areas TA (refer to FIG. 3) may be increased.

Since the interval between adjacent ones of the second opening areas OA2 is relatively wide in the second mask area MA2, effective volume and effective thickness of the second mask area MA2 may be greater than those of the first mask area MA1. Here, the "effective volume" may refer to a remaining volume of a mask sheet 520 (refer to FIG. 5) in comparison to an original volume of a parent material by an "effective ratio". The "effective thickness" may refer to a calculated thickness obtained by converting a remaining volume into the effective thickness in comparison to an original thickness of the parent material based on the effective volume. For example, the "effective thickness" may be simply calculated by multiplication of the original thickness by the effective ratio, but the calculation of the "effective thickness" is not limited by the above-mentioned method, and various equations or empirical formulas may be used to calculate the effective thickness. For example, the effective volume and effective thickness of the mask sheet 520 (refer to FIG. 5) may decrease as a volume of a removed portion, which is removed from the parent material, increases. For example, the effective volume and effective thickness of the mask sheet 520 (refer to FIG. 5) may decrease as the overall size of the opening area per unit area increases.

When the interval between the adjacent ones of the second opening areas OA2 is greater than the interval between the adjacent ones of the first opening areas OA1 in order to form the transmission areas TA (refer to FIG. 3) in the second display area DA2 (refer to FIG. 3), the effective volume and the effective thickness of the mask sheet 520 (refer to FIG. 5) in the second mask area MA2 may be greater than the effective volume and the effective thickness of the mask sheet 520 in the first mask area MA1. When the effective volume and the effective thickness in the first mask area MA1 is different from those in the second mask area MA2, a defect may be caused in the manufacturing process. For example, when the difference of the effective volume and the effective thickness in the first and second mask areas MA1 and MA2 is increased, a magnetic force may not be applied uniformly to the mask assembly 500 (refer to FIG. 5), and accordingly, a repulsive force may be generated between the mask assembly 500 (refer to FIG. 5) and the process target S (refer to FIG. 5). The repulsive force may prevent the mask assembly 500 (refer to FIG. 5) from being tightly adhered to the process target S (refer to FIG. 5), and thus the quality of the deposition process may be deteriorated.

In order to prevent the above-mentioned problem, the mask assembly 500 (refer to FIG. 5) according to an embodiment may have a structure capable of minimizing the difference between the effective volume and the effective thickness in the first mask area MA1 and the effective volume and the effective thickness in the second mask area MA2. Also, in the mask assembly 500 (refer to FIG. 5) according to an embodiment, the difference between the effective thickness of the first mask area MA1 and the effective thickness of the second mask area MA2 may be controlled to within a predetermined range.

FIG. 8 is a graph illustrating the relationship between the repulsive force and the effective thickness difference of the mask assembly 500 (refer to FIG. 5). In FIG. 8, the "effective thickness difference" may refer to the difference between the effective thickness of the first mask area MA1 and the effective thickness of the second mask area MA2. The "repulsive force" may refer to the repulsive force generated between the mask assembly 500 (refer to FIG. 5) and the process target S (refer to FIG. 5) in the deposition process.

Referring to FIG. 8, a repulsive force was generated when the effective thickness difference exceeds about 3 μm, and the strength of the generated repulsive force increased as the effective thickness difference increased. Thus, in the mask assembly 500 (refer to FIG. 5) according to an embodiment, the effective thickness difference, for example, the difference between the effective thickness of the first mask area MA1 and the effective thickness of the second mask area MA2 was controlled to be about 3 μm or less.

Hereinafter, embodiments capable of reducing the effective volume and the effective thickness in the second mask area MA2 is provided with reference to the drawings.

Figure 9:
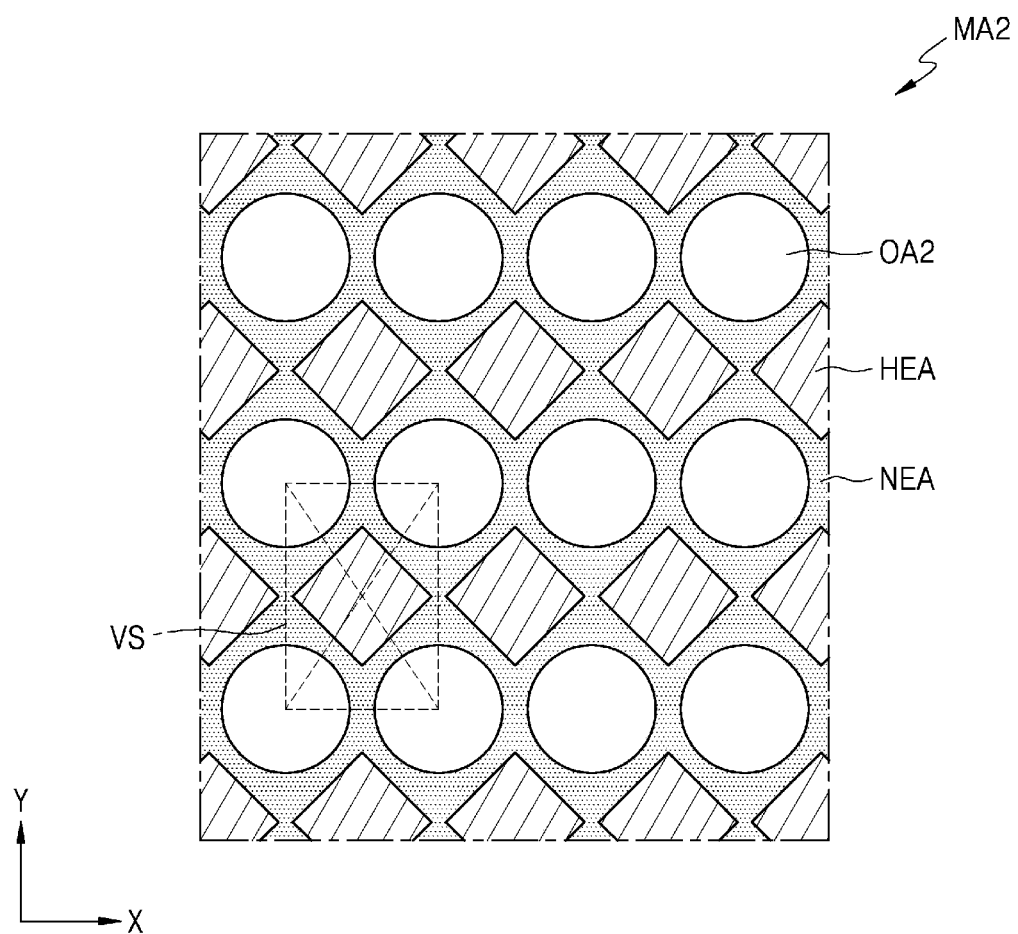
FIG. 9 is a plan view schematically illustrating a portion of a second mask area of a mask assembly according to an embodiment.

FIG. 9 is a plan view schematically illustrating a portion of a second mask area of a mask assembly according to an embodiment.

Referring to FIG. 9, the second mask area MA2 of the mask assembly 500 (refer to FIG. 5) according to an embodiment may include second opening areas OA2, half-etching areas HEA, and a non-etching area NEA.

In an embodiment, the second mask area MA2 may include the second opening areas OA2, the half-etching areas HEA, and the non-etching area NEA, which are arranged with respect to virtual squares VS arranged in a row direction and a column direction of the second mask area MA2. Centers of the second opening areas OS2 are disposed at vertexes of the virtual squares VS. For example, centers of adjacent four second opening areas OS2 define each of the virtual squares VS. Centers of the half-etching areas HEA of are disposed at centers of the virtual squares VS. The non-etching area NEA surrounds the second opening areas OA2 and the half-etching areas HEA. Here, the non-etching area NEA may be disposed between the second opening areas OA2 which are adjacent to each other, between one of the second opening areas OA2 and one of the half-etching areas HEA which is adjacent to the second opening area OA2, and between the half-etching areas HEA which are adjacent to each other.

The mask sheet 520 (refer to FIG. 5) may be manufactured by etching a parent material. The second opening areas OA2, the half-etching areas HEA, and the non-etching area NEA may be formed from the mask sheet 520 (refer to FIG. 5) based on an etching degree. A portion of the parent material in the second opening area OA2 is completely etched to form an opening. A portion of the parent material in the non-etching area NEA is not etched or etched at a negligible amount, and thus all or most of the parent material remains in the non-etching area NEA, and a thickness of the parent material is similar to an original thickness of the parent material in the non-etching area NEA. A portion of the parent material in the half-etching area HEA is partially etched, and the etching amount in the half-etching area HEA is between those of the second opening area OA2 and the non-etching area NEA. The remaining portion of the parent material in the half-etching area HEA has a thickness smaller than the original thickness of the parent material.

When the mask sheet 520 (refer to FIG. 5) includes the second opening areas OA2, the half-etching areas HEA, and the non-etching area NEA in the second mask area MA2, the effective volume and effective thickness of the second mask area MA2 may be smaller than an effective volume and effective thickness of a second mask area MA2 of a mask sheet 520 only including a second opening area OA2 and a non-etching area NEA in the second mask area MA2. Accordingly, the difference between the effective volume and the effective thickness of the first mask area MA1 and the effective volume and the effective thickness of the second mask area MA2 may be reduced.

Figure 10:
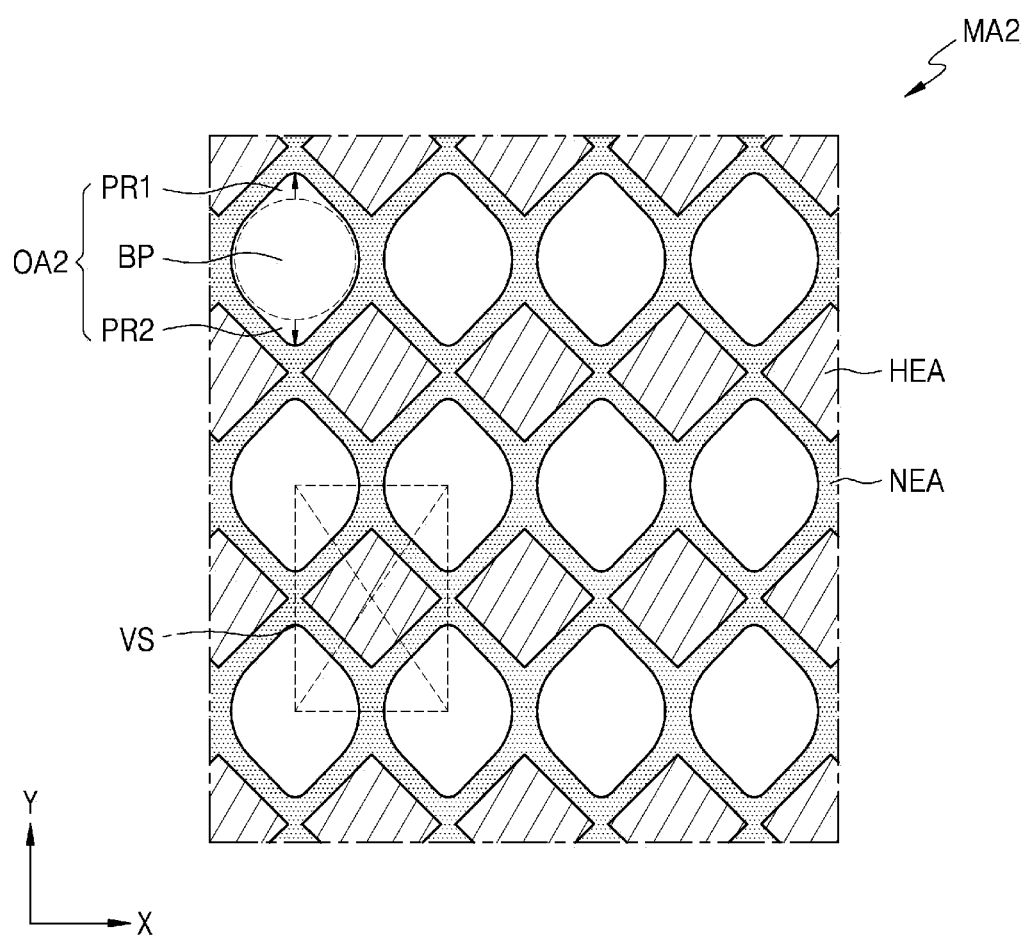
FIG. 10 is a plan view schematically illustrating a portion of a second mask area of a mask assembly according to other embodiments.
Figure 11:
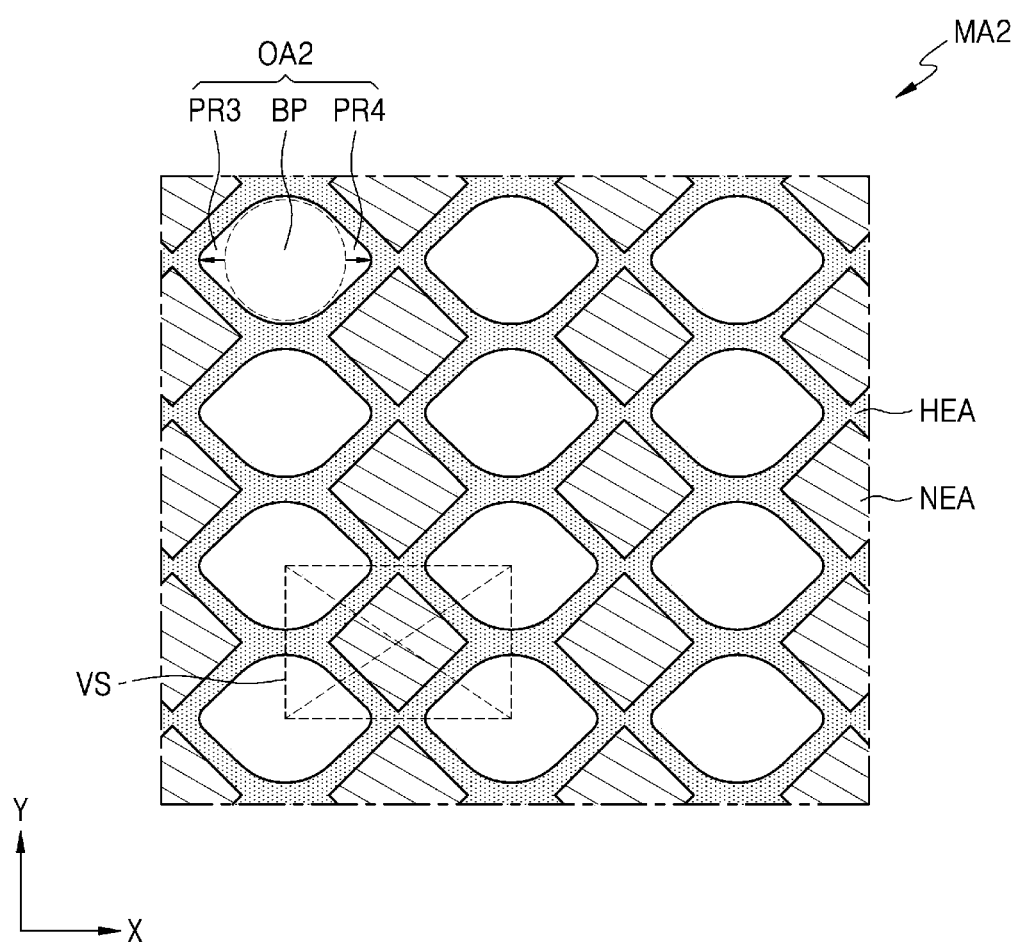
FIG. 11 is a plan view schematically illustrating a portion of a second mask area of a mask assembly according to other embodiments.
Figure 12:
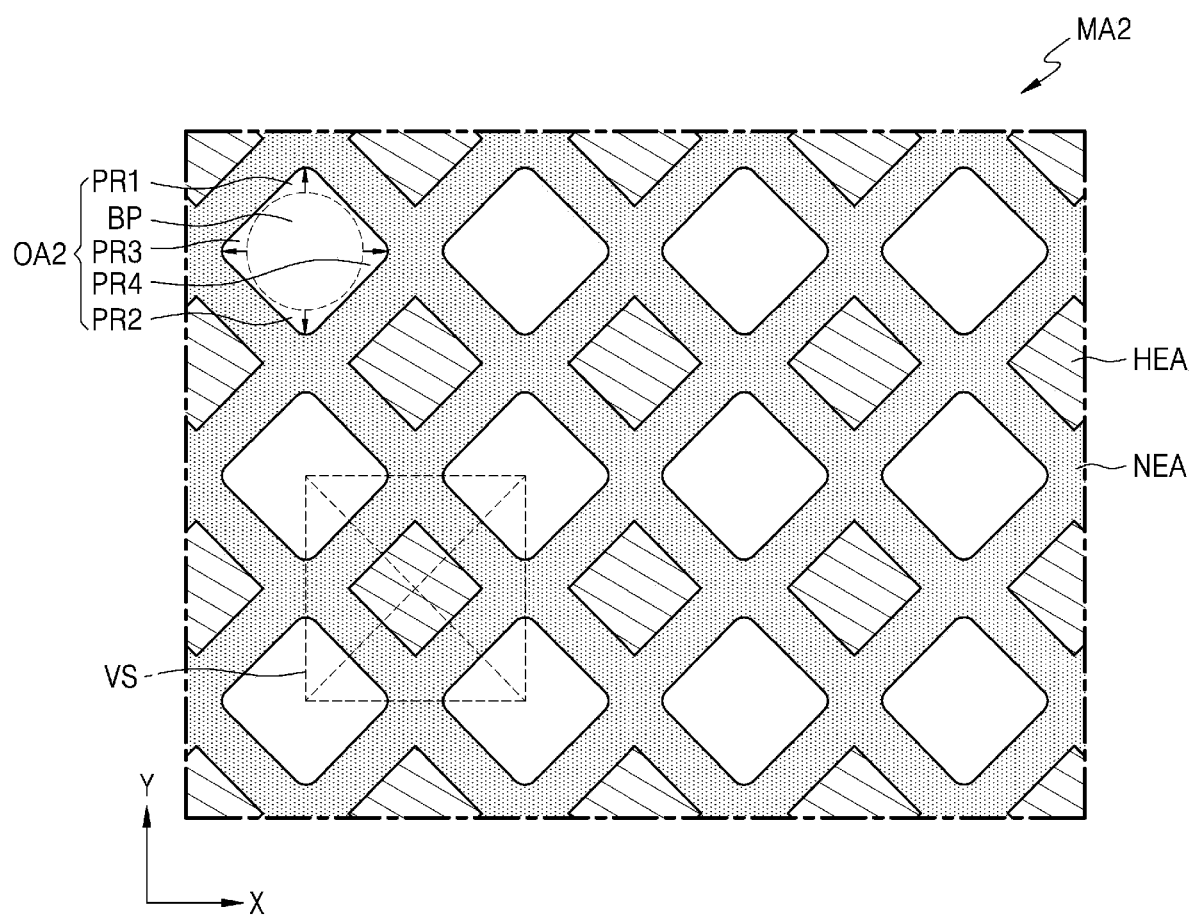
FIG. 12 is a plan view schematically illustrating a portion of a second mask area of a mask assembly according to other embodiments.

FIG. 10 is a plan view schematically illustrating a portion of a second mask area of a mask assembly according to other embodiments, FIG. 11 is a plan view schematically illustrating a portion of a second mask area of a mask assembly according to other embodiments, and FIG. 12 is a plan view schematically illustrating a portion of a second mask area of a mask assembly according to other embodiments.

Hereinafter, like reference numerals in the drawings denote like elements, and thus, redundant descriptions with respect to those described above will be omitted and differences from FIG. 9 will be mainly described.

Referring to FIGS. 10 to 12, the second mask area MA2 of the mask assembly 500 (refer to FIG. 5) according to an embodiment may include second opening areas OA2, half-etching areas HEA, and a non-etching area NEA, which are arranged with respect to virtual squares VS arranged in a row direction and a column direction of the second mask area MA2. Centers of the second opening areas OS2 are disposed at vertexes of the virtual squares VS. Centers of the half-etching areas HEA are disposed at centers of the virtual squares VS. The non-etching area NEA surrounds the second opening areas OA2 and the half-etching areas HEA. Here, the non-etching area NEA may be disposed between the second opening areas OA2 which are adjacent to each other, between one the second opening areas OA2 and one of the half-etching areas HEA which is adjacent to the second opening area OA2, and between the half-etching areas HEA which are adjacent to each other.

In order to minimize the effective volume and the effective thickness of the second mask area MA2, a diameter (or an area) of the second opening areas OA2 may be maximized. For example, when a size of the second opening areas OA2 is increased, a size of the non-etching area NEA disposed between the second opening area OA2 and the half-etching area HEA adjacent to the second opening area OA2 may be reduced. Thus, the effective volume and the effective thickness of the second mask area MA2 may be increased by reducing area size of the non-etching area NEA disposed between the second opening area OA2 and the half-etching area HEA.

Each of the second opening areas OA2 may include a base portion BP and at least one protrusion portion protruding from the base portion BP. The base portion BP may include a center portion of the second opening area OA2 and a portion adjacent thereto. The protrusion portion may be a portion protruding in one direction from one side of the base portion BP.

In an embodiment, as illustrated in FIG. 10, an interval between adjacent ones of the second opening areas OA2 in the row direction (e.g., an x-axis direction) may be smaller than an interval between adjacent ones of the second opening areas OA2 in the column direction (e.g., a y-axis direction). For example, a length of the virtual squares VS in the row direction may be smaller than a length of the virtual squares VS in the column direction. Each of the virtual squares VS are defined by centers of adjacent four second opening areas OA2. Accordingly, a portion of the non-etching area NEA disposed on upper and lower sides of the second opening areas OA2 may be greater than a portion of the non-etching area NEA disposed on left and right sides of the second opening areas OA2. Although the second opening areas OA2 expand in the upper and lower direction in the second mask area MA2, the structural stability of the mask assembly 500 (refer to FIG. 5) may be maintained.

Thus, the protrusion portion disposed in the second opening areas OA2 may include an upper protrusion portion PR1 protruding from an upper side of the base portion BP and a lower protrusion portion PR2 protruding from a lower side of the base portion BP. Accordingly, in the plan view, the second subpixels Pa (refer to FIG. 3) or the second emission layer 222ab (refer to FIG. 4) of the second subpixels Pa (refer to FIG. 3) may also have protrusion portions which protrude from an upper side and a lower side of each center portion thereof. The second subpixels Pa (refer to FIG. 3) or the second emission layer 222ab (refer to FIG. 4) of the second subpixels Pa (refer to FIG. 3) may have the same shape and size as the second opening areas OA2 having the base portion BP, the upper protrusion portion PR1 and the lower protrusion portion PR2.

For example, when the effective thickness of the first mask area MA1 is 7.18 μm, the effective thickness of the second mask area MA2 illustrated in FIG. 9 may be 11.22 μm. However, the effective thickness of the second mask area MA illustrated in FIG. 10 may be reduced to 7.99 μm. Thus, the difference of the effective thickness in the first and second mask areas MA and MA2 may be reduced from 4.04 μm to 0.81 μm. It should be under stood that the embodiments are not limited by the numerical values of the examples.

In another embodiments, as illustrated in FIG. 11, an interval between adjacent ones of the second opening areas OA2 in a row direction (e.g., an x-axis direction) may be greater than an interval between adjacent ones of the second opening areas OA2 in a column direction (e.g., a y-axis direction). For example, a length of the virtual squares VS in the row direction may be greater than a length of the virtual squares VS in the column direction. Each of the virtual squares VS are defined by centers of adjacent four second opening areas OA2. Accordingly, a portion of the non-etching area NEA disposed on left and right sides of the second opening areas OA2 may be greater than a portion of the non-etching area NEA disposed on upper and lower sides of the second opening areas OA2. Although the second opening areas OA2 expand in the left and right direction in the second mask area MA2, the structural stability of the mask assembly 500 (refer to FIG. 5) thereof may be maintained. Each of the second opening areas OA2 may include a base portion BP and two protrusion portions PR3 and PR4 protruding from the base portion BP.

Thus, the protrusion portions PR3 and PR4 disposed in the second opening areas OA2 may include a left protrusion portion PR3 protruding from a left side of the base portion BP and a right protrusion portion PR4 protruding from a right side of the base portion BP. Accordingly, in the plan view, the second subpixels Pa (refer to FIG. 3) or the second emission layer 222ab (refer to FIG. 4) of the second subpixels Pa (refer to FIG. 3) may also have two protrusion portions which protrude from a left side and a right side of each center portion thereof. The second subpixels Pa (refer to FIG. 3) or the second emission layer 222ab (refer to FIG. 4) of the second subpixels Pa (refer to FIG. 3) may have the same shape and size as the second opening areas OA2 having the base portion BP, the left protrusion portion PR3 and the right protrusion portion PR4.

In another embodiments, as illustrated in FIG. 12, both intervals between adjacent ones of the second opening areas OA2 in a row direction (e.g., an x-axis direction) and a column direction (e.g., a y-axis direction) may be sufficiently great compared with those illustrated in FIGS. 10 and 11. Thus, a size of the transmission areas TA (refer to FIG. 3) may be sufficiently increased. The second opening areas OA2 may be arranged to have various intervals in the row direction and the column direction. The intervals of the second opening areas OA2 may have various relationships in the row direction and the column direction. For example, the interval of the second opening areas OA2 in the row direction may be smaller or greater than the interval of the second opening areas OA2 in the column direction. Also, the interval of the second opening areas OA2 in the row direction may be the same as the interval of the second opening areas OA2 in the column direction. For example, a length of virtual squares VS in the row direction may be smaller or greater than a length of the virtual squares VS in the column direction. Each of the virtual squares VS are defined by centers of adjacent four second opening areas OA2. Also, a length of the virtual squares VS in the row direction may be the same as a length of the virtual squares VS in the column direction. Although the second opening areas OA2 expand in the upper, lower, left, and right directions in the second mask area MA2, the structural stability of the mask assembly 500 (refer to FIG. 5) may be maintained. Each of the second opening areas OA2 may include a base portion BP and four protrusion portions PR1, PR2, PR3, and PR4 protruding from the base portion BP.

Thus, the protrusion portions PR1, PR2, PR3, and PR4 disposed in the second opening areas OA2 may include an upper protrusion portion PR1 protruding from an upper side of the base portion BP, a lower protrusion portion PR2 protruding from a lower side of the base portion BP, a left protrusion portion PR3 protruding from a left side of the base BP, and a right protrusion portion PR4 protruding from a right side of the base BP. Accordingly, in the plan view, the second subpixels Pa (refer to FIG. 3) or the second emission layer 222ab (refer to FIG. 4) of the second subpixels Pa (refer to FIG. 3) may also have four protrusion portions which protrude from an upper side, a lower side, a left side, and a right side of each center portion thereof. The second subpixels Pa (refer to FIG. 3) or the second emission layer 222ab (refer to FIG. 4) of the second subpixels Pa (refer to FIG. 3) may have the same shape and size as the second opening areas OA2 having the base portion BP, the upper protrusion PR1, the lower protrusion portion PR2, the left protrusion portion PR3, and the right protrusion portion PR4.

Although only the mask assembly and the apparatus for manufacturing the display device have been mainly described above, but the invention and embodiment are not limited thereto. Other modifications are possible and within the sprit and scope of the invention. For example, an apparatus for manufacturing the display device using the mask assembly will also be within the sprit and the scope of the invention.

As described above, it may be possible to implement a mask assembly capable of preventing a defect that may occur in a mask process by minimizing generation of a repulsive force between the mask assembly and a process target in the mask process and an apparatus for manufacturing a display device. However, the scope of the disclosure is not limited to these effects.

It should be understood that embodiments described herein should be considered in a descriptive sense only and not for purposes of limitation. Descriptions of features or aspects within each embodiment should be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A mask assembly comprising:
    a first mask area including first opening areas; and
    a second mask area including:
        second opening areas having centers, each center respectively located at vertices of one of virtual rectangles arranged in a row direction and a column direction;
        half-etching areas having centers located at centers of the virtual rectangles or rectangles; and
        a non-etching area surrounding the second opening areas and the half-etching areas,
    wherein each of the second opening areas includes a base portion and at least one protrusion portion protruding from the base portion.

2. The mask assembly of claim 1, wherein the at least one protrusion portion includes:
    an upper protrusion portion protruding from a first side of the base portion; and
    a lower protrusion portion protruding from a second side opposite to the first-lower side of the base portion.

3. The mask assembly of claim 2, wherein
    each of the virtual rectangles has a side in the row direction and a side in the column direction, and
    a length of the side in the row direction is less than a length of the side in the column direction.

4. The mask assembly of claim 1, wherein the at least one protrusion portion includes:
    a left protrusion portion protruding from a left side of the base portion; and
    a right protrusion portion protruding from a right side of the base portion.

5. The mask assembly of claim 4, wherein
    each of the virtual rectangles has a side in the row direction and a side in the column direction, and
    a length of the side in the row direction is greater than a length of the side in the column direction.

6. The mask assembly of claim 1, wherein the at least one protrusion portion includes:
    an upper protrusion portion protruding from an upper side of the base portion;
    a lower protrusion portion protruding from a lower side of the base portion;
    a left protrusion portion protruding from a left side of the base portion; and
    a right protrusion portion protruding from a right side of the base portion.

7. The mask assembly of claim 6, wherein
    each of the virtual rectangles has a side in the row direction and a side in the column direction, and
    a length of the side in the row direction is equal to a length of the side in the column direction.

8. The mask assembly of claim 1, wherein an effective thickness of the second mask area is greater than an effective thickness of the first mask area.

9. The mask assembly of claim 8, wherein a difference between the effective thickness of the first mask area and the effective thickness of the second mask area is about 3 um or less.

10. The mask assembly of claim 1, wherein an interval between adjacent ones of the second opening areas is greater than an interval between adjacent ones of the first opening areas.

11. The mask assembly of claim 10, wherein a diameter of each of the second opening areas is greater than a diameter of each of the first opening areas.

12. An apparatus for manufacturing a display device including a first display area in which first subpixels are disposed and a second display area in which second subpixels are disposed, the apparatus comprising:
    a chamber in which a substrate is arranged; and
    a mask assembly that forms an emission layer over the substrate, wherein
    the mask assembly comprises:
        a first mask area including first opening areas; and
        a second mask area including:
            second opening areas having centers located at vertices of virtual rectangles in a row direction and a column direction;
            half-etching areas having centers located at centers of the virtual rectangles; and
            a non-etching area surrounding the second opening areas and the half-etching areas,
    each of the second opening areas includes a base portion and at least one protrusion portion protruding from the base portion,
    the emission layer of each of the first subpixels has a shape corresponding to a shape of the first opening areas, and
    the emission layer of each of the second subpixels has a shape corresponding to a shape of the second opening areas.

13. The apparatus for manufacturing the display device of claim 12, wherein the at least one protrusion portion includes:
    an upper protrusion portion protruding from a first side of the base portion; and
    a lower protrusion portion protruding from a second side opposite to the first side of the base portion.

14. The apparatus for manufacturing the display device of claim 13, wherein a first side and a second side opposite to the first side of the emission layer of each of the second subpixels protrude in a plan view.

15. The apparatus for manufacturing the display device of claim 12, wherein the at least one protrusion portion includes:
    a left protrusion portion protruding from a left side of the base portion; and
    a right protrusion portion protruding from a right side of the base portion.

16. The apparatus for manufacturing the display device of claim 15, wherein a left side and a right side of the emission layer of each of the second subpixels protrude in a plan view.

17. The apparatus for manufacturing the display device of claim 12, wherein the at least one protrusion portion includes:
    an upper protrusion portion protruding from a first side of the base portion;

a lower protrusion portion protruding from a second side opposite to the first side of the base portion;
a left protrusion portion protruding from a left side of the base portion; and
a right protrusion portion protruding from a right side of the base portion.

18. The apparatus for manufacturing the display device of claim 17, wherein a first side, a second side opposite to the first side, a left side, and a right side of the emission layer each of the second subpixels protrude in a plan view.

19. The apparatus for manufacturing the display device of claim 12, wherein
an effective thickness of the second mask area is greater than an effective thickness of the first mask area, and
a difference between the effective thickness of the first mask area and the effective thickness of the second mask area is about 3 um or less.

20. The apparatus for manufacturing the display device of claim 12, wherein
an interval between adjacent ones of the second opening areas is greater than an interval between adjacent ones of the first opening areas,
a diameter of each of the second opening areas is greater than a diameter of each of the first opening areas,
an interval between emission layers of adjacent ones of the second subpixels is smaller than an interval between emission layers of adjacent ones of the first subpixels, and
a diameter of the emission layer of each of the second subpixels is greater than a diameter of the emission layer of each of the first subpixels.

* * * * *